(12) United States Patent  
Maeda

(10) Patent No.: US 6,573,153 B2
(45) Date of Patent: *Jun. 3, 2003

(54) METHOD OF MANUFACTURING SEMICONDUCTOR DEVICE

(75) Inventor: Shigenobu Maeda, Chiyoda-ku (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/073,337

(22) Filed: Feb. 13, 2002

(65) Prior Publication Data

US 2002/0072161 A1 Jun. 13, 2002

Related U.S. Application Data

(63) Continuation of application No. 09/689,793, filed on Oct. 13, 2000, now Pat. No. 6,358,800.

(30) Foreign Application Priority Data

Apr. 17, 2000 (JP) ........................................ 2000-114963

(51) Int. Cl.[7] ................................................. H01L 21/76
(52) U.S. Cl. ........................ 438/427; 438/424; 438/154
(58) Field of Search .............................. 438/928, 459, 438/404, 405, 406, 153, 154, 427, 424

(56) References Cited

U.S. PATENT DOCUMENTS

| 5,120,675 A | 6/1992 | Pollack ........................ 438/404 |
| 5,378,919 A | 1/1995 | Ochiai |
| 5,654,573 A | 8/1997 | Oashi et al. |
| 5,882,827 A | 3/1999 | Nakao ............................. 430/5 |
| 5,985,739 A | 11/1999 | Plettner et al. |
| 6,274,457 B1 | 8/2001 | Sakai et al. |
| 6,358,820 B1 | 3/2002 | Maeda ........................ 438/154 |

FOREIGN PATENT DOCUMENTS

| DE | 41 12 285 | 1/1992 |
| DE | 198 57 059 A1 | 6/1999 |
| EP | 0 489 539 | 6/1992 |
| JP | 7-161809 | 6/1995 |
| JP | 10-144894 | 5/1998 |

OTHER PUBLICATIONS

Preliminary Search Report in for French Patent application No. 00 16211, dated Oct. 7, 2002.

Primary Examiner—Trung Dang
(74) Attorney, Agent, or Firm—Oblon, Spivak, McClelland, Maier, & Neustadt, R.C.

(57) ABSTRACT

Obtained is a method of manufacturing a semiconductor device which can take a body contact while electrically isolating an NMOS transistor and a PMOS transistor from each other through a complete isolation. First of all, element isolating films (7a to 7c) of a partial isolation type are formed in a first main surface of a silicon layer (3). Next, a PMOS transistor, an NMOS transistor, a multilayer wiring structure, a spiral inductor (20) and a pad (22) are formed, respectively. Then, a support substrate (23) is formed over the whole surface. Thereafter, a silicon substrate (1) and a BOX layer (2) are removed to expose a second main surface of the silicon layer (3). Subsequently, element isolating films (27a to 27d) connected to the element isolating films (7a and 7b) are formed on the second main surface side of the silicon layer (3). Consequently, a complete isolation can be obtained.

7 Claims, 27 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device using an SOI substrate.

2. Description of the Background Art

FIG. 44 is a sectional view showing a structure of a conventional semiconductor device using an SOI substrate. The SOI substrate has a multilayer structure in which a silicon substrate 101, a BOX (Buried Oxide) layer 102 and a silicon layer 103 are provided in this order. Element isolating films 107a to 107c having bottom surfaces positioned above an upper surface of the BOX layer 102 are selectively formed in an upper surface of the silicon layer 103. Such an isolation will be hereinafter referred to as "a partial isolation".

A PMOS transistor is formed in an element formation region defined by the element isolating films 107a and 107b. The PMOS transistor has $p^+$ type source-drain regions 114a1 and 114a2 opposed to each other with an $n^-$ type channel formation region 113a interposed therebetween, a gate structure 110a having a multilayer structure in which a gate insulating film 108 and a gate electrode 109a are provided in this order, and a side wall 111 formed on a side surface of the gate structure 110a. The source-drain regions 114a1 and 114a2 and the channel formation region 113a are formed in an $n^-$ type well 112a.

Moreover, an NMOS transistor is formed in an element formation region defined by the element isolating films 107b and 107c. The NMOS transistor has $n^+$ type source-drain regions 114b1 and 114b2 opposed to each other with a $p^-$ type channel formation region 113b interposed therebetween, a gate structure 110b having a multilayer structure in which a gate insulating film 108 and a gate electrode 109b are provided in this order, and a side wall 111 formed on a side surface of the gate structure 110b. The source-drain regions 114b1 and 114b2 and the channel formation region 113b are formed in a $p^-$ type well 112b.

According to the conventional semiconductor device shown in FIG. 44, the element isolating films 107a to 107c of a partial isolation type are formed in the upper surface of the silicon layer 103. Accordingly, electric potentials of the channel formation regions 113a and 113b can be externally fixed through the silicon layer 103 between the bottom surfaces of the element isolating films 107a to 107c and the upper surface of the BOX layer 102. In other words, a body contact can be taken.

However, the element isolating film 107b of the partial isolation type is also formed in a boundary portion of the $n^-$ type well 112a and the $p^-$ type well 112b. Therefore, the $p^+$ type source-drain region 114a2 and the $n^+$ type source-drain region 114b1 are electrically connected to each other through the $n^-$ type well 112a and the $p^-$ type well 112b which are provided under the element isolating film 107b. Consequently, there has been a problem in that a parasitic thyristor structure is formed in this portion so that latch up is generated.

SUMMARY OF THE INVENTION

In order to solve such a problem, it is an object of the present invention to obtain a method of manufacturing a semiconductor device which can take a body contact while electrically isolating an NMOS transistor and a PMOS transistor from each other through an insulator formed from an upper surface of a semiconductor layer to a bottom surface thereof (hereinafter referred to as "a complete isolation") and can also contribute to microfabrication of an element.

A first aspect of the present invention is directed to a method of manufacturing a semiconductor device comprising the steps of (a) preparing a substrate having a multilayer structure in which an underlying layer and a semiconductor layer are provided, (b) selectively forming a first element isolating film which is not in contact with the underlying layer in a first main surface of the semiconductor layer on a side which is not in contact with the underlying layer, (c) forming an element having a conductor region which is positioned only above the first element isolating film on the first main surface of the semiconductor layer, (d) removing at least a part of the underlying layer, and (e) selectively forming a second element isolating film which is in contact with the first element isolating film below the conductor region in a second main surface of the semiconductor layer after the step (d).

A second aspect of the present invention is directed to a method of manufacturing a semiconductor device comprising the steps of (a) preparing a substrate having a multilayer structure in which an underlying layer and a semiconductor layer are provided, (b) selectively forming a first element isolating film which has a bottom portion shallower than bottoms of a first well of a first conductivity type and a second well of a second conductivity type and is not in contact with the underlying layer in a first main surface of the semiconductor layer on a side which is not in contact with the underlying layer in at least one of a first boundary portion between a region where the first well is to be formed and a region where the second well is to be formed and a second boundary portion between a region where a first semiconductor element is to be formed and a region where a second semiconductor element is to be formed in wells of the same conductivity type, (c) removing at least a part of the underlying layer, and (d) selectively forming a second element isolating film which is in contact with the first element isolating film in a second main surface of the semiconductor layer after the step (c).

A third aspect of the present invention is directed to a method of manufacturing a semiconductor device, comprising the steps of (a) preparing a substrate having a first main surface including a boundary between a first region and a second region, (b) selectively forming, in the first main surface of the substrate, a concave portion having a bottom surface which does not reach a second main surface of the substrate on a side opposite to the first main surface in a portion including the boundary, (c) forming a negative photoresist on a structure obtained at the step (b), (d) exposing the photoresist by using a photomask through which a phase of a light emitted above the first region and a phase of a light emitted above the second region are reverse to each other, (e) developing the photoresist after the step (d), (f) removing the substrate in a portion exposed at the step (e), thereby forming a through trench which penetrates from the bottom surface of the concave portion to the second main surface of the substrate, and (g) filling the concave portion and the through trench with an insulating film.

A fourth aspect of the present invention is directed to the method of manufacturing a semiconductor device according to the third aspect of the present invention, wherein the first region is a first well of a first conductivity type, the second region is a second well of a second conductivity type, the photoresist is exposed by using a phase-shifting mask having a shifter pattern in which a shifter for inverting a phase of an incident light is formed above the first region or above the second region at the step (d), and the shifter pattern is created based on design data in which layouts of the first and second wells in the substrate are described.

A fifth aspect of the present invention is directed to the method of manufacturing a semiconductor device according to the third aspect of the present invention, further comprising the step of (h) forming a semiconductor element having a conductor region on the substrate after the step (g), the concave portion being also formed below a region where the conductor region is to be formed at the step (b), and the photoresist being exposed by using a photomask having a mask pattern in which a light shielding film is formed above the region where the conductor region is to be formed at the step (d).

A sixth aspect of the present invention is directed to the method of manufacturing a semiconductor device according to the fifth aspect of the present invention, wherein the mask pattern is created based on design data in which a layout of the conductor region in the semiconductor element is described.

According to the first aspect of the present invention, the element isolating film of a complete isolation type having the first and second element isolating films is formed below the conductor region. Therefore, it is possible to avoid the generation of a parasitic capacitance between the conductor region and the semiconductor layer.

According to the second aspect of the present invention, the element isolating film of a complete isolation type having the first and second element isolating films is formed in at least one of the first boundary portion and the second boundary portion. Consequently, it is possible to avoid at least one of the influence of electrical connection of the first well and the second well through the semiconductor layer and the influence of electrical connection of the first semiconductor element and the second semiconductor element through the semiconductor layer.

According to the third aspect of the present invention, the through trench having a very small width can be formed. Therefore, it is possible to minimize the influence of the formation of a complete isolation having a great isolation width in the boundary portion between the first region and the second region, for example, a reduction in a channel width. Moreover, the microfabrication of the semiconductor device can also be obtained.

According to the fourth aspect of the present invention, the shifter pattern of the phase-shifting mask is created based on the design data created in the design stage. Consequently, it is possible to fabricate a phase-shifting mask having a desirable shifter pattern without creating any new data.

According to the fifth aspect of the present invention, the element isolating film of a complete isolation type having the insulating film filling the concave portion and the through trench can be formed below the conductor region. Consequently, it is possible to avoid the generation of a parasitic capacitance between the conductor region and the substrate.

According to the sixth aspect of the present invention, the mask pattern is created based on the design data created in the design stage. Consequently, it is possible to fabricate a photomask having a desirable mask pattern without creating any new data.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
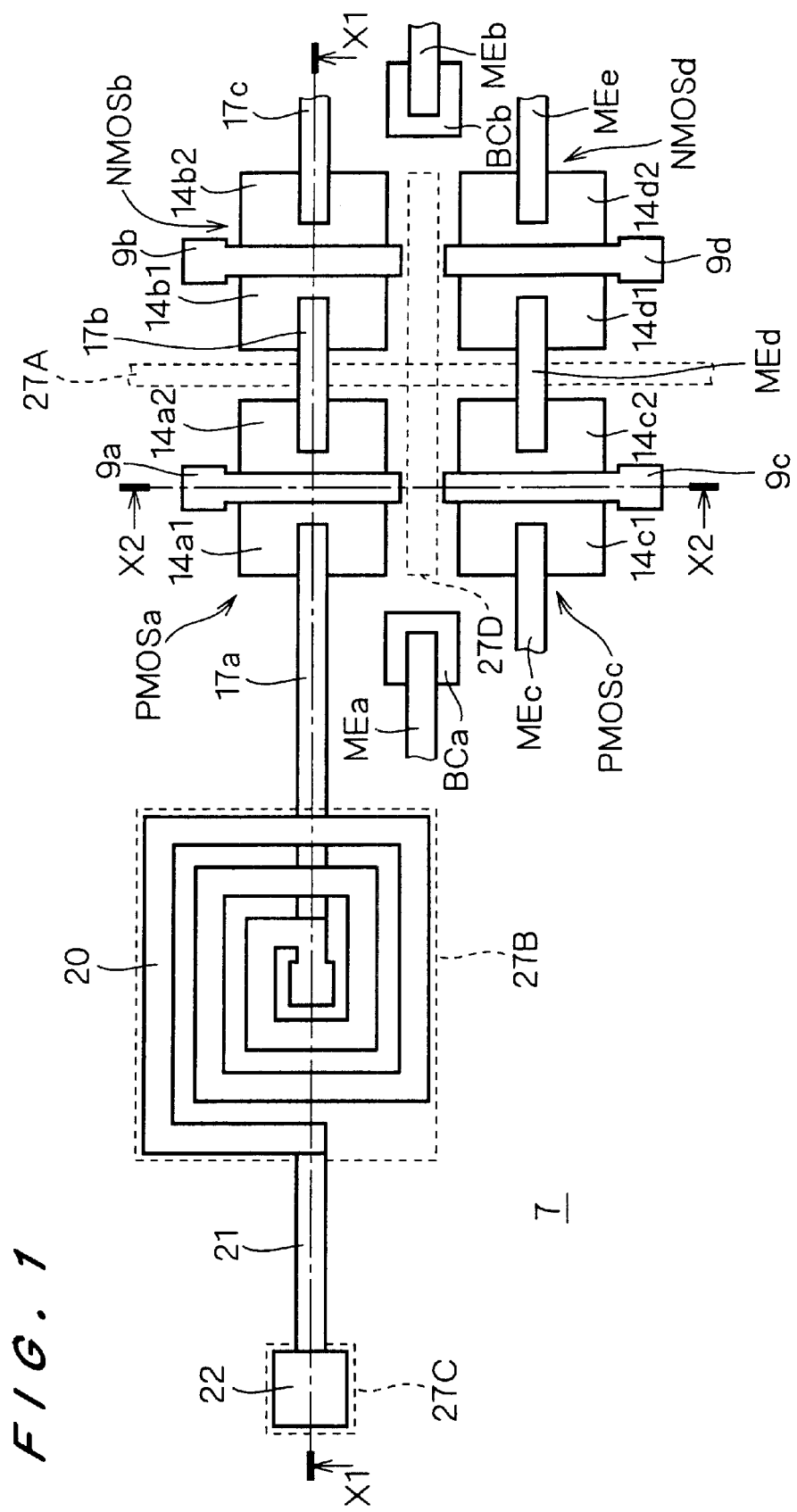
FIG. 1 is a top view typically showing an example of a layout of a semiconductor device.

FIG. 1 is a top view typically showing an example of a layout of a semiconductor device. The semiconductor device shown in FIG. 1 comprises four MOS transistors (PMOSa, NMOSb, PMOSc and NMOSd) provided adjacently to each other, a spiral inductor 20 and a pad 22. The PMOSa has source-drain regions 14$a$1 and 14$a$2 and a gate electrode 9$a$, the NMOSb has source-drain regions 14$b$1 and 14$b$2 and a gate electrode 9$b$, the PMOSc has source-drain regions 14$c$1 and 14$c$2 and a gate electrode 9$c$, and the NMOSd has source-drain regions 14$d$1 and 14$d$2 and a gate electrode 9$d$.

The source-drain region 14$a$1 is connected to the spiral inductor 20 through a wiring 17$a$, the source-drain regions 14$a$2 and 14$b$1 are connected to each other through a wiring 17$b$, and the source-drain region 14$b$2 is connected to a wiring 17$c$. Moreover, the spiral inductor 20 is connected to the pad 22 through a wiring 21. Furthermore, the source-drain regions 14$c$1 and 14$d$2 are connected to wirings MEc and MEe respectively, and the source-drain regions 14$c$2 and 14$d$1 are connected to each other through a wiring MEd.

The semiconductor device shown in FIG. 1 comprises a body contact region BCa for fixing each electric potential of each channel formation region (which overlaps with the gate electrodes 9$a$ and 9$c$ and does not appear in FIG. 1) of the PMOSa and the PMOSc. The body contact region BCa is connected to a metal wiring MEa. Moreover, the semiconductor device shown in FIG. 1 comprises a body contact region BCb for fixing each electric potential of each channel formation region (which overlaps with the gate electrodes 9$b$ and 9$d$ and does not appear in FIG. 1) of the NMOSb and the NMOSd. The body contact region BCb is connected to a metal wiring MEb.

A partial isolation 7 and a complete isolation 27A are formed between the PMOSa and the NMOSb and between the PMOSc and the NMOSd. Moreover, the partial isolation 7 and a complete isolation 27D are formed between the PMOSa and the PMOSc and between the NMOSb and the NMOSd. Both the complete isolations 27A and 27D do not need to be formed and at least one of them may be formed to answer the purpose. Of course, both of them may be formed.

In order to prevent latch up from being generated, the complete isolation 27A is formed and the PMOS and the NMOS are electrically isolated completely from each other. In order to perfectly prevent the latch up from being generated, it is sufficient that the complete isolation 27A is formed to surround the PMOS formation region and the PMOS body contact region and to surround the NMOS formation region and the NMOS body contact region, which is not shown in FIG. 1. As will be described below, the provision of the complete isolation 27A in a boundary portion between an N well and a P well can prevent the latch up from being generated. Moreover, it is sufficient that the complete isolation 27D is formed in order to reduce a noise made between circuits provided adjacently to each other. Furthermore, a complete isolation 27B is formed below the spiral inductor 20 and a complete isolation 27C is formed below the pad 22.

Figure 2:
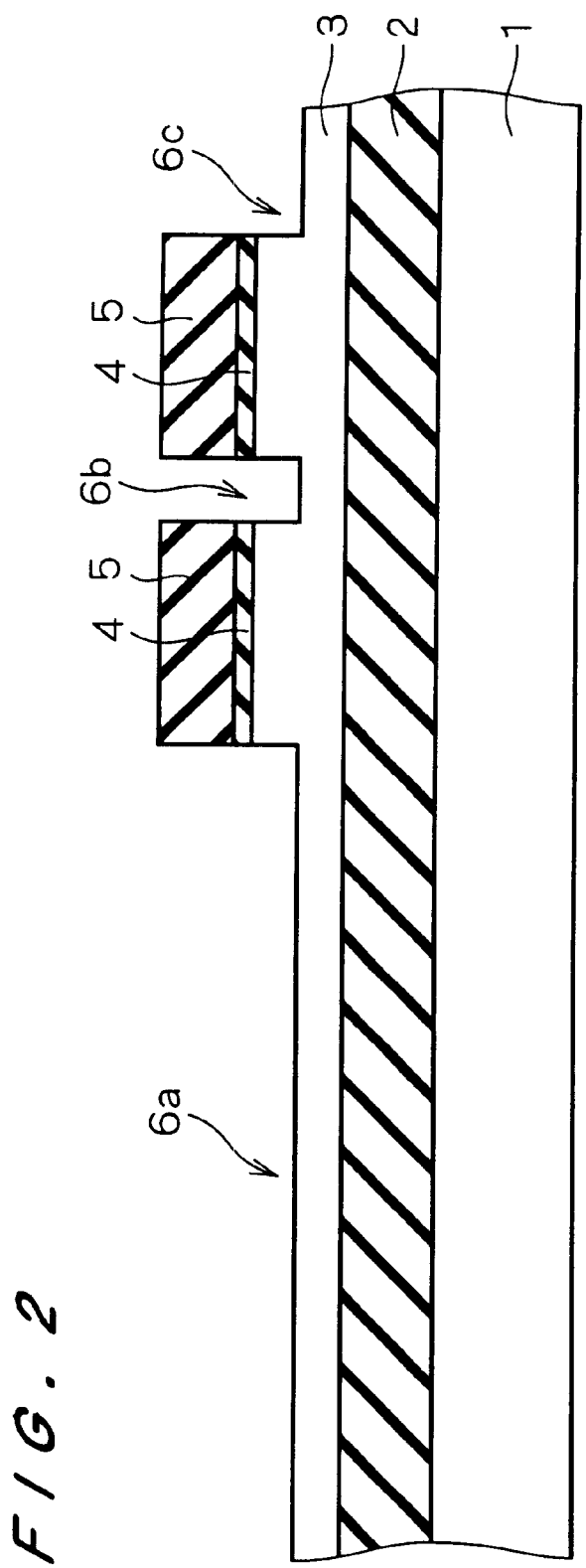
FIGS. 2 to 25 are sectional views showing, in order of steps, a method of manufacturing a semiconductor device according to a first embodiment of the present invention.

Referring to a section in a position along a line X1 shown in FIG. 1, description will be given to a method of manufacturing a semiconductor device according to a first embodiment. FIGS. 2 to 20 are sectional views showing, in order of steps, the method of manufacturing a semiconductor device according to the first embodiment. First of all, an SOI substrate having a multilayer structure in which a silicon substrate 1, a BOX layer 2 and a silicon layer 3 are provided in this order is prepared. Then, a silicon oxide film 4 and a silicon nitride film 5 are wholly formed in this order over a first main surface of the silicon layer 3 (on the side which is not in contact with the BOX layer 2). Thereafter, the silicon nitride film 5 is subjected to patterning and etching is carried out by using the residual silicon nitride film 5 as a mask. Consequently, concave portions 6a to 6c having bottom portions in the silicon layer 3 are formed through the silicon oxide film 4 (FIG. 2).

Figure 3:
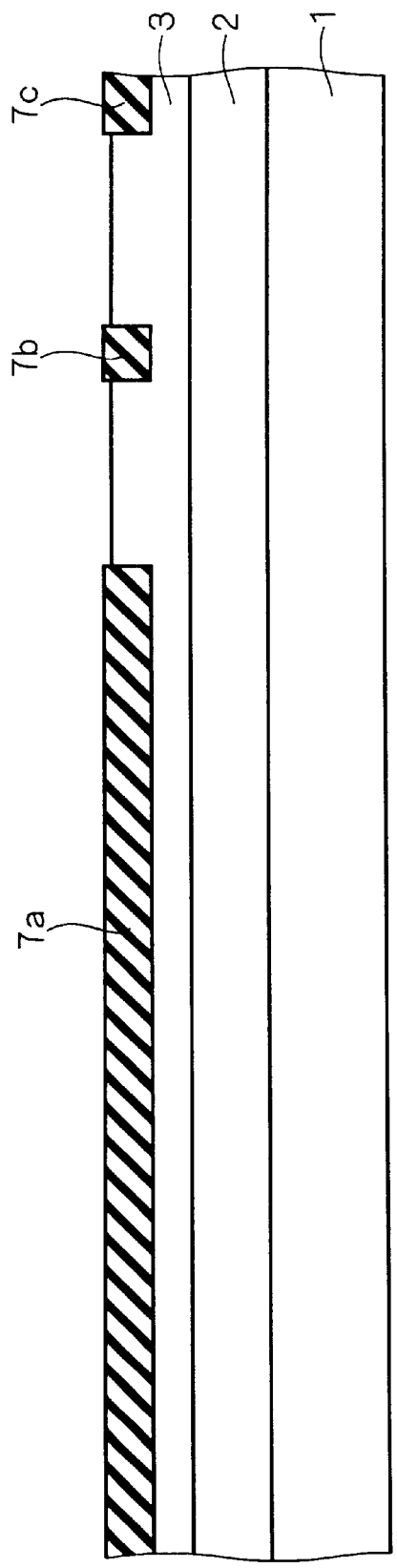

Next, an insulating film such as a silicon oxide film is deposited over the whole surface in such a thickness as to bury at least the concave portions 6a to 6c. Then, a CMP treatment is carried out. The CMP treatment is stopped leaving a part of the silicon nitride film 5. Thereafter, the residual silicon nitride film 5 and the silicon oxide film 4 are removed through wet etching. Consequently, element isolating films 7a to 7c of a partial isolation type can be formed in the first main surface of the silicon layer 3 (FIG. 3).

After the etching for forming the concave portions 6a to 6c is carried out, ion implantation may be performed in order to provide a high concentration impurity region under the element isolating films 7a to 7c before the insulating film is deposited.

Alternatively, the etching for forming the concave portions 6a to 6c may be stopped in a stage in which the first main surface of the silicon layer 3 is exposed. In this case, the concave portion generated after the etching is filled with the insulating film to form the element isolating films 7a to 7c. Subsequently, the silicon oxide film 4 and the silicon nitride film 5 are removed and silicon is then epitaxially grown over the first main surface of the silicon layer 3. Consequently, a structure shown in FIG. 3 can be obtained.

Figure 4:
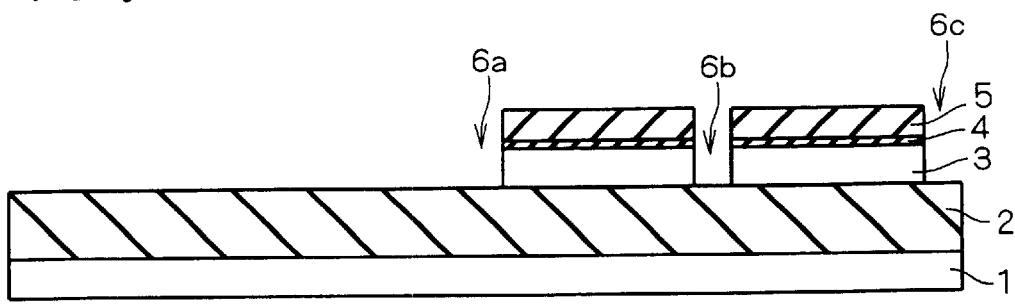
Figure 5:
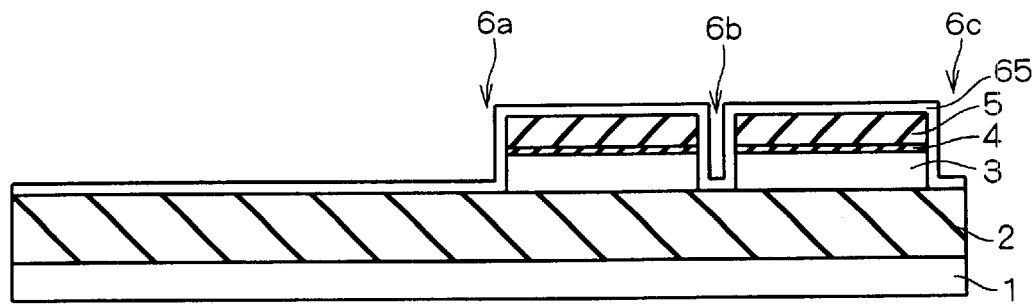
Figure 6:
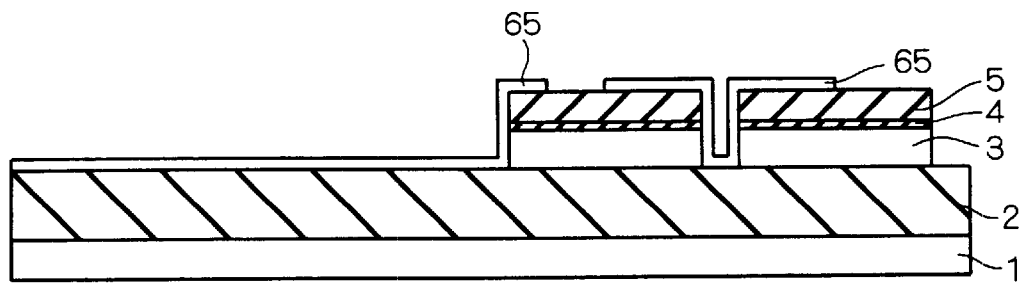
Figure 7:
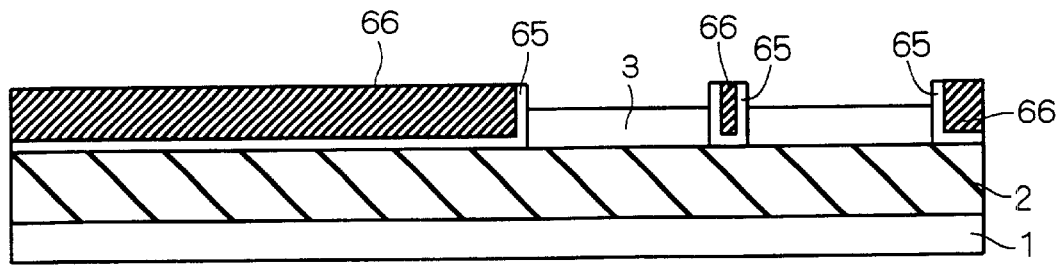
Figure 8:
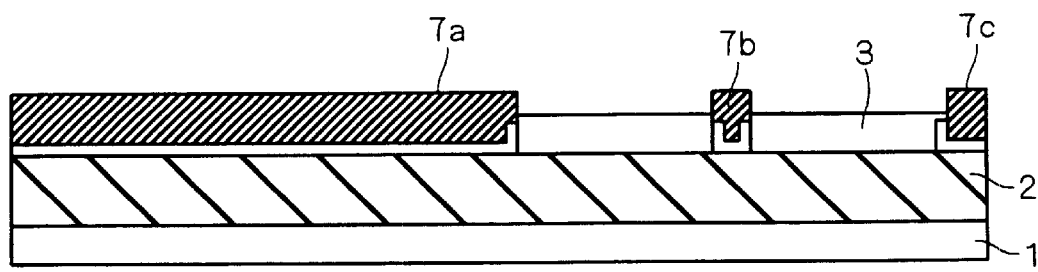

Alternatively, an upper surface of the BOX layer 2 may be exposed through the etching for forming the concave portions 6a to 6c (FIG. 4). Next, a polysilicon film 65 is formed over the whole surface in such a thickness as not to bury the concave portions 6a to 6c (FIG. 5), and is then removed through selective etching leaving the inside of the concave portions 6a to 6c and the opening periphery thereof (FIG. 6). Thereafter, an insulating film 66 to bury the concave portions 6a to 6c is deposited over the whole surface through the polysilicon film 65 and the silicon nitride film 5 is exposed by the CMP treatment. Subsequently, the silicon nitride film 5 and the silicon oxide film 4 are removed (FIG. 7). Thereafter, an upper portion of the polysilicon film 65 is oxidized so that the element isolating films 7a to 7c comprising the insulating film 66 and the oxidized polysilicon film 65 are obtained (FIG. 8).

Figure 9:
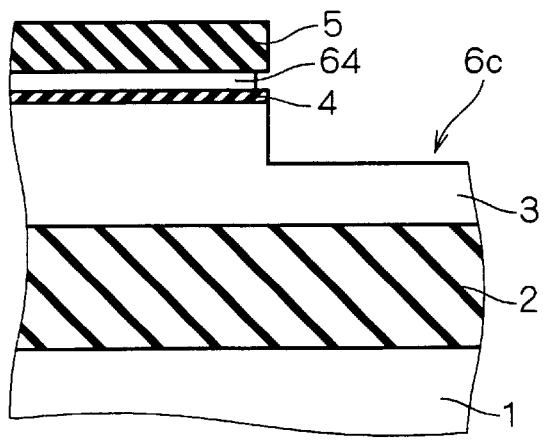
Figure 10:
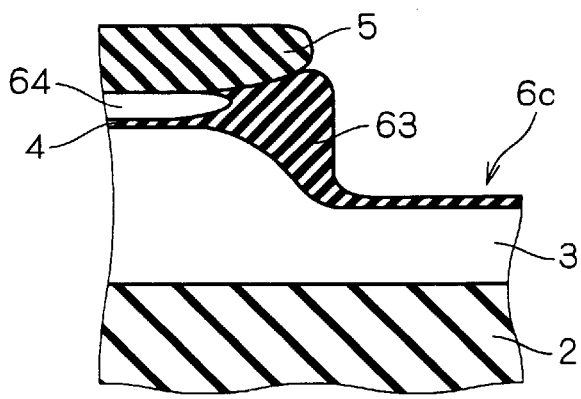
Figure 11:
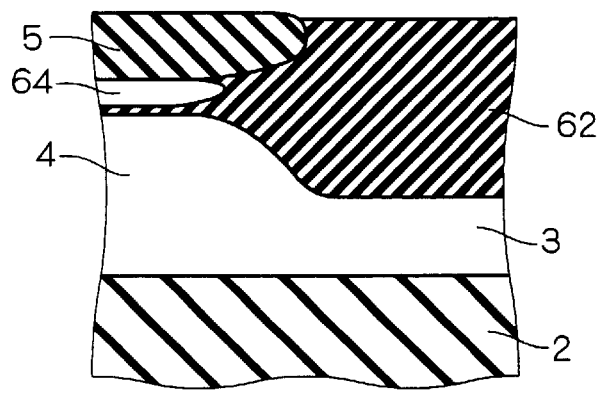

Alternatively, a polysilicon layer 64 may be provided between the silicon oxide film 4 and the silicon nitride film 5 (FIG. 9). After the concave portion 6c is formed, the polysilicon layer 64 and the silicon layer 3 are oxidized to form a silicon oxide film 63 covering an internal wall of the concave portion 6c (FIG. 10). Subsequently, an insulating film 62 to bury the concave portion 6c through the silicon oxide film 63 is deposited over the whole surface, and the silicon nitride film 5 is then exposed by the CMP treatment (FIG. 11). Consequently, it is possible to form the element isolating film 7c having a bird's beak shape which makes a pair vertically on the end of the silicon nitride film 5. Thereafter, the silicon oxide film 4 and the silicon nitride film 5 are removed. Such steps can also be applied to the element isolating films 7a and 7b.

Referring to various methods of forming an element isolating film of a partial isolation type described above, the present applicant has filed U.S. application Ser. No. 09/466, 934 on Dec. 20, 1999 and U.S. application Ser. No. 09/639, 953 on Aug. 17, 2000, and all the disclosure of these applications are herein incorporated by reference.

Subsequently to the step shown in FIG. 3, next, a boundary is defined in the element isolating film 7b and an n$^-$ type N well 12a and a p$^-$ type P well 12b are formed in the silicon layer 3 by an ion implantation method. The bottoms of the N well 12a and the P well 12b are positioned more deeply than the bottom surfaces of the element isolating films 7a to 7c. Then, a gate structure 10a a having a multilayer structure in which a gate oxide film 8 and a gate electrode 9a are provided in this order is selectively formed on the first main surface of the silicon layer 3 in a first element formation region of the SOI substrate defined by the element isolating films 7a and 7b. Moreover, a gate structure 10b having a multilayer structure in which the gate oxide film 8 and a gate electrode 9b are provided in this order is selectively formed on the first main surface of the silicon layer 3 in a second element formation region of the SOI substrate defined by the element isolating films 7b and 7c. Next, a side wall 11 comprising an insulating film is formed on side surfaces of the gate structures 10a and 10b, respectively.

Next, p$^+$ type source-drain regions 14a1 and 14a2 are formed by the ion implantation method in the silicon layer 3 in the first element formation region. A region interposed between the source-drain regions 14a1 and 14a2 is defined as an n$^-$ type channel formation region 13a. Then, n$^+$ type source-drain regions 14b1 and 14b2 are formed by the ion implantation method in the silicon layer 3 in the second element formation region. A region interposed between the source-drain regions 14b1 and 14b2 is defined as a p$^-$ type channel formation region 13b (FIG. 12).

Figure 12:
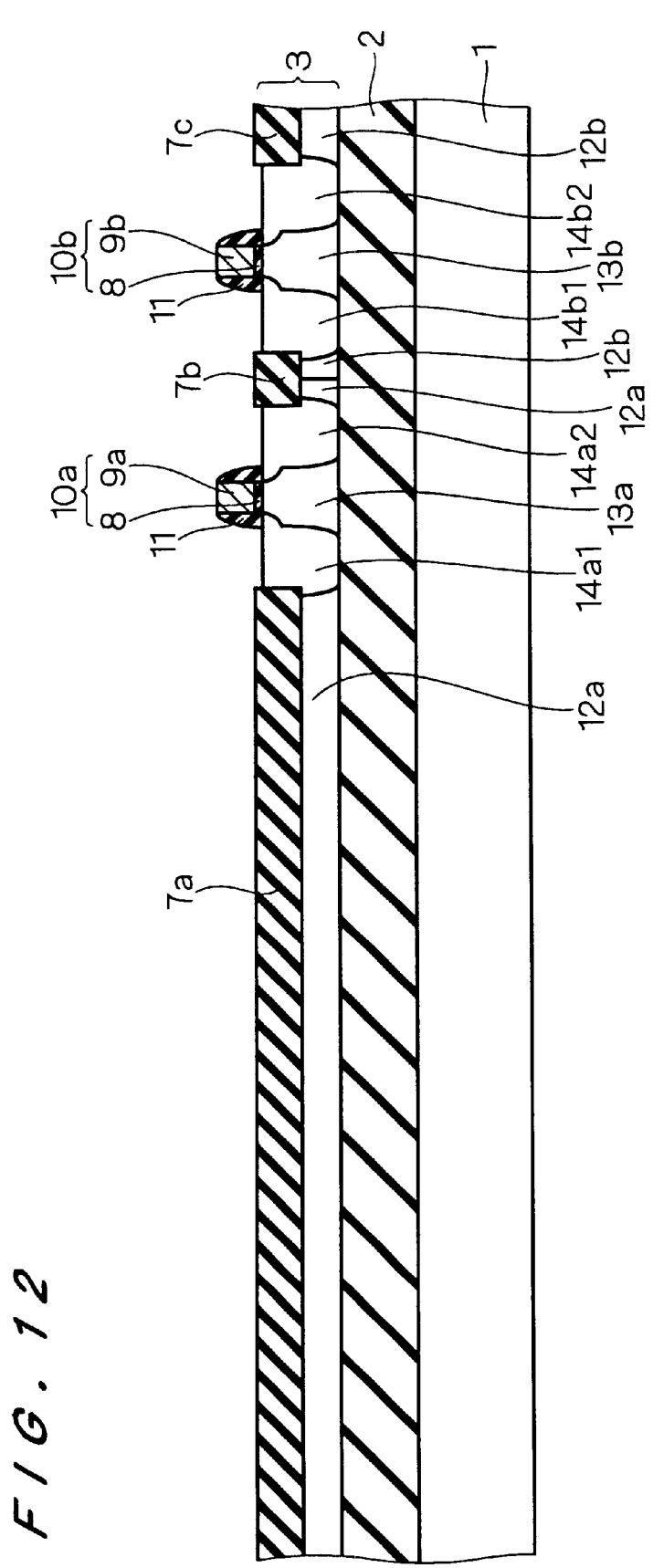
Figure 13:
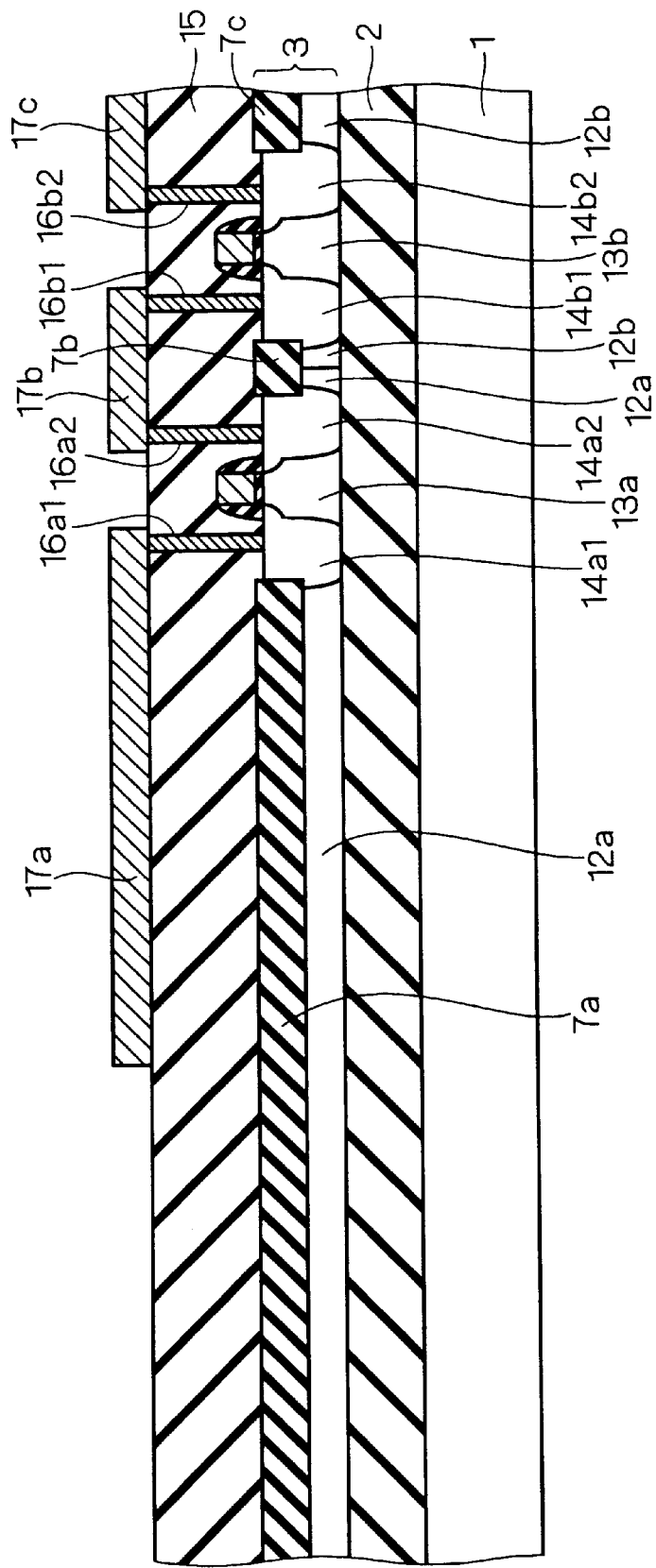

Then, after an interlayer insulating film 15 is formed over the whole surface of the structure shown in FIG. 12, contact holes 16a1, 16a2, 16b1 and 16b2 connected to the source-drain regions 14a1, 14a2, 14b1 and 14b2 and filled with a metal plug such as tungsten are selectively formed in the interlayer insulating film 15, respectively. Thereafter, wirings 17a to 17c formed of a metal such as aluminum are selectively formed on the interlayer insulating film 15, respectively. The wiring 17a is connected to the contact hole 16a1, the wiring 17b is connected to the contact holes 16a2 and 16b1, and the wiring 17c is connected to the contact hole 16b2 (FIG. 13).

Figure 14:
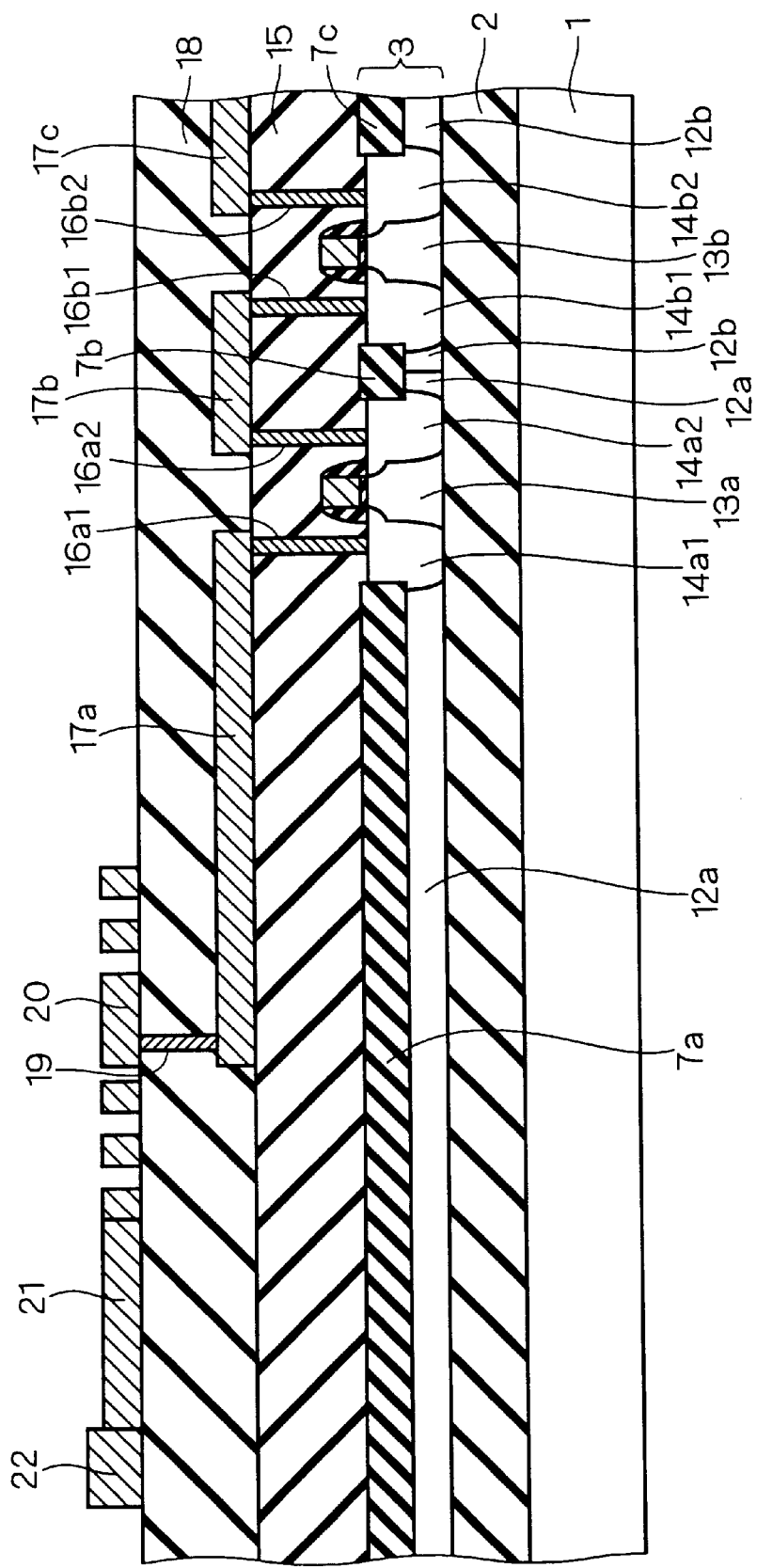

Subsequently, after an interlayer insulating film 18 is formed over the whole surface of the structure shown in FIG. 13, a contact hole 19 connected to the wiring 17a and filled with a metal plug is selectively formed in the interlayer insulating film 18. Next, a spiral inductor 20 connected to the contact hole 19, a wiring 21 connected to the spiral inductor 20 and a pad 22 connected to the wiring 21 are selectively formed on the interlayer insulating film 18, respectively (FIG. 14). As shown in FIG. 14, the spiral inductor 20 and the pad 22 are provided only above the element isolating film 7a.

Figure 15:
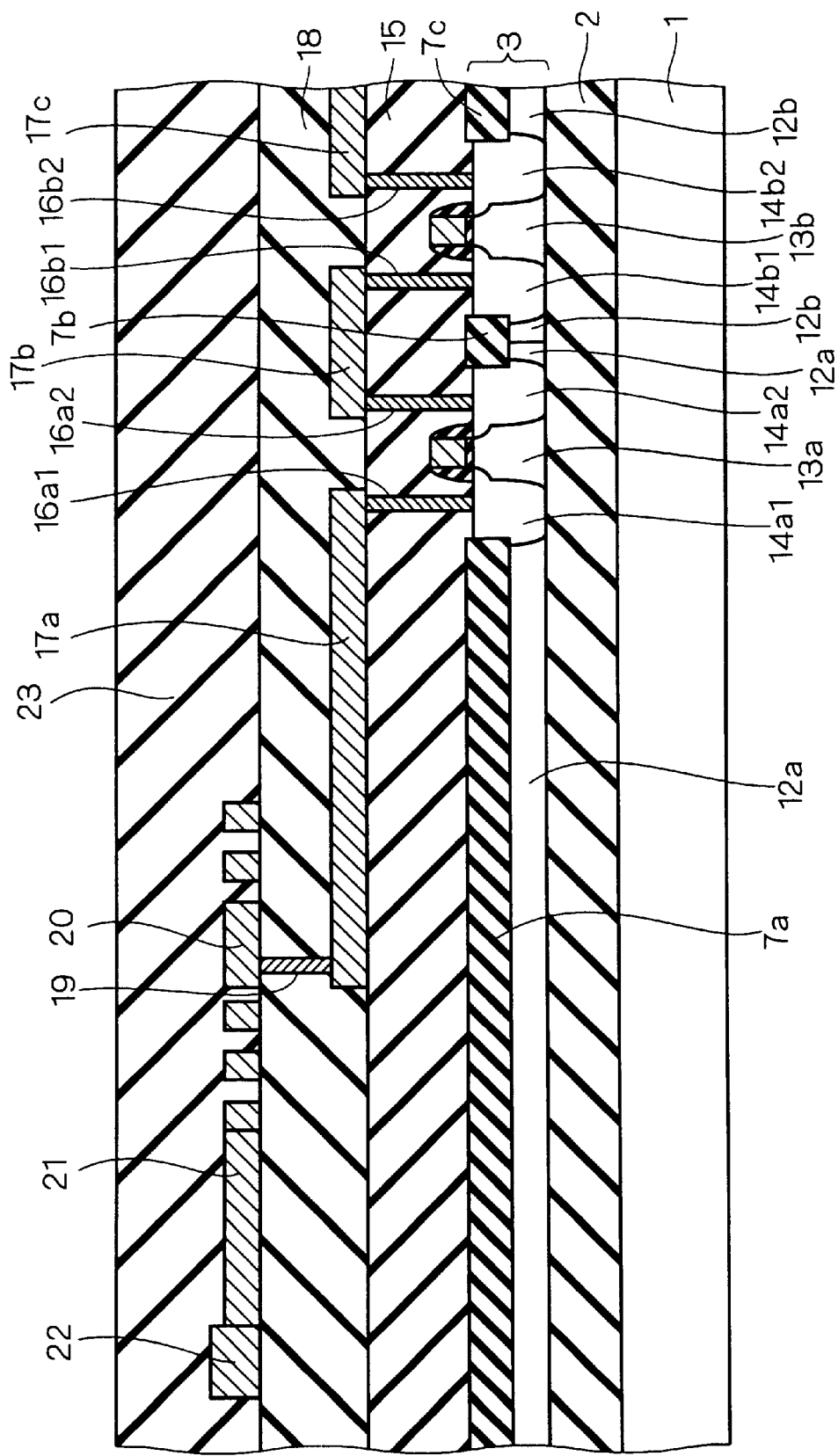
Figure 16:
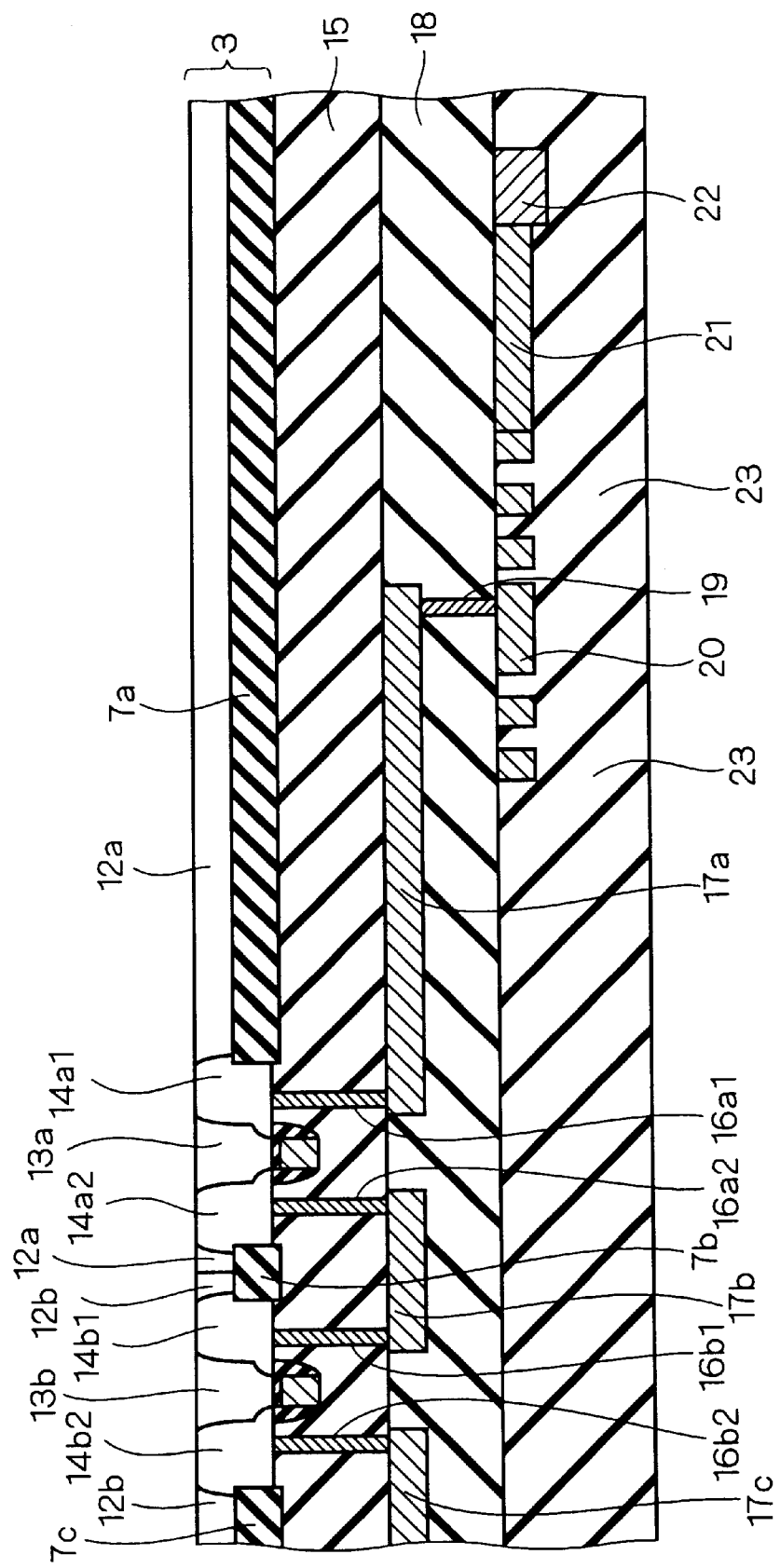

Next, a support substrate 23 comprising an insulating film such as a silicon oxide film is formed over the whole surface of the structure shown in FIG. 14 by a wafer bonding method, for example (FIG. 15). Then, the structure shown in FIG. 15 is inverted vertically and most of the silicon substrate 1 is removed through mechanical grinding. Then, wet etching using KOH is carried out, thereby completely removing the silicon substrate 1 and exposing the BOX layer 2, for example. Thereafter, the BOX layer 2 is removed through wet etching using HF so that the second main surface of the silicon layer 3 (on the side which is not in contact with the interlayer insulating film 15) is exposed (FIG. 16). The BOX layer 2 is removed through the wet etching using the HF. Consequently, it is possible to prevent the second main surface of the silicon layer 3 from being damaged at the step of removing the BOX layer 2.

Figure 17:
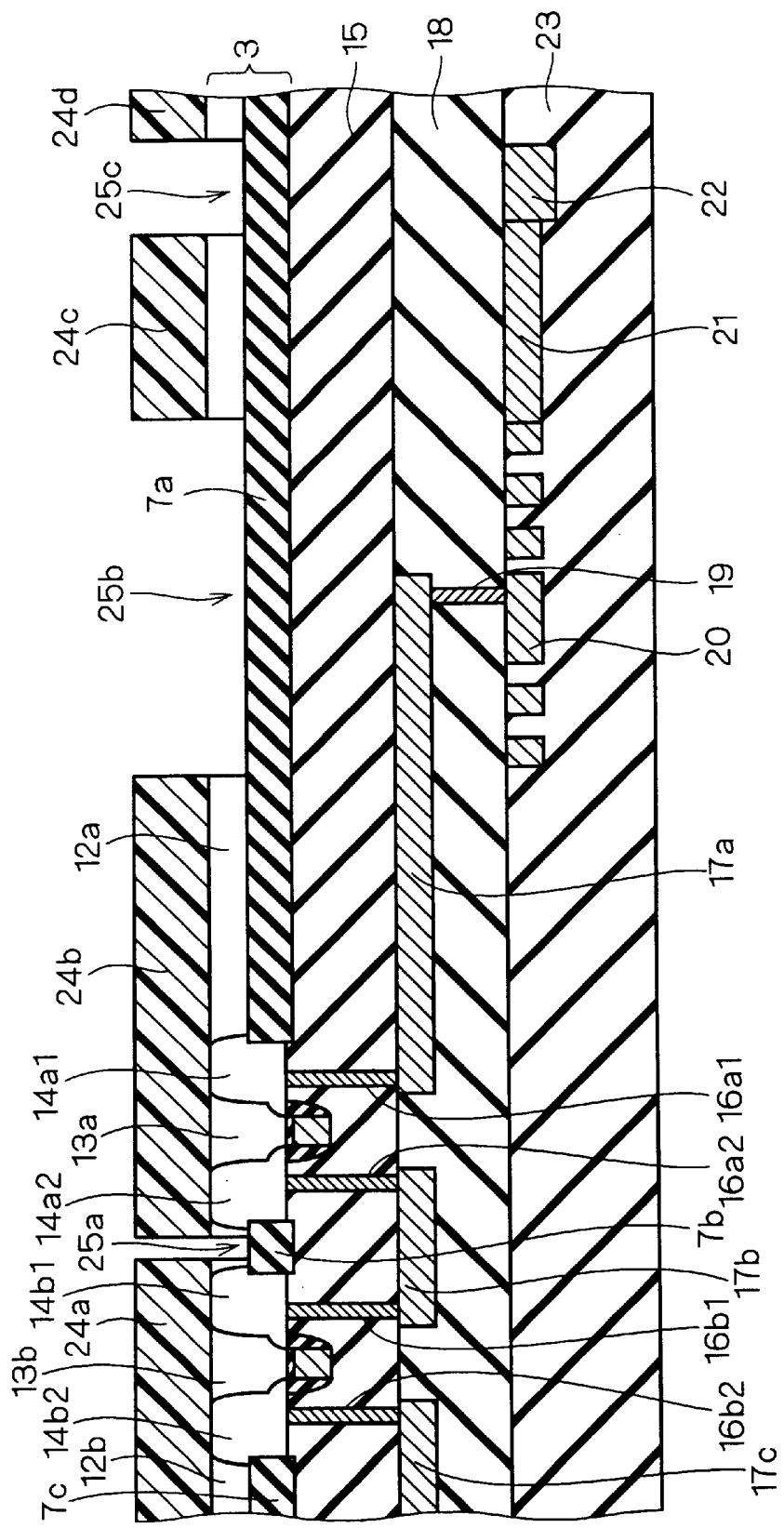

Then, photoresists 24a to 24d having opening patterns above a region where a complete isolation is to be formed are provided on the second main surface of the silicon layer 3. More specifically, the opening patterns of the photoresists 24a to 24d are provided above a boundary portion between the N well 12a and the P well 12b, above the spiral inductor 20 and above the pad 22. Next, the silicon layer 3 is subjected to etching until the element isolating films 7a and 7b are exposed by using the photoresists 24a to 24d as masks. Thus, concave portions 25a to 25c are formed (FIG. 17). The concave portions 25a to 25c may be formed by a method which will be described below in a second embodiment.

While the BOX layer 2 has completely been removed at the step shown in FIG. 16, it may be removed by a predetermined thickness with a part left. In this case, the BOX layer 2 and the silicon layer 3 are subjected to etching in this order until the element isolating films 7a and 7b are exposed by using, as masks, the photoresists 24a to 24d formed on the residual BOX layer 2. Consequently, the concave portions 25a to 25c are formed. Thus, it is possible to prevent the whole second main surface of the silicon layer 3 from being exposed to the outside air and to easily carry out quality control.

Figure 18:
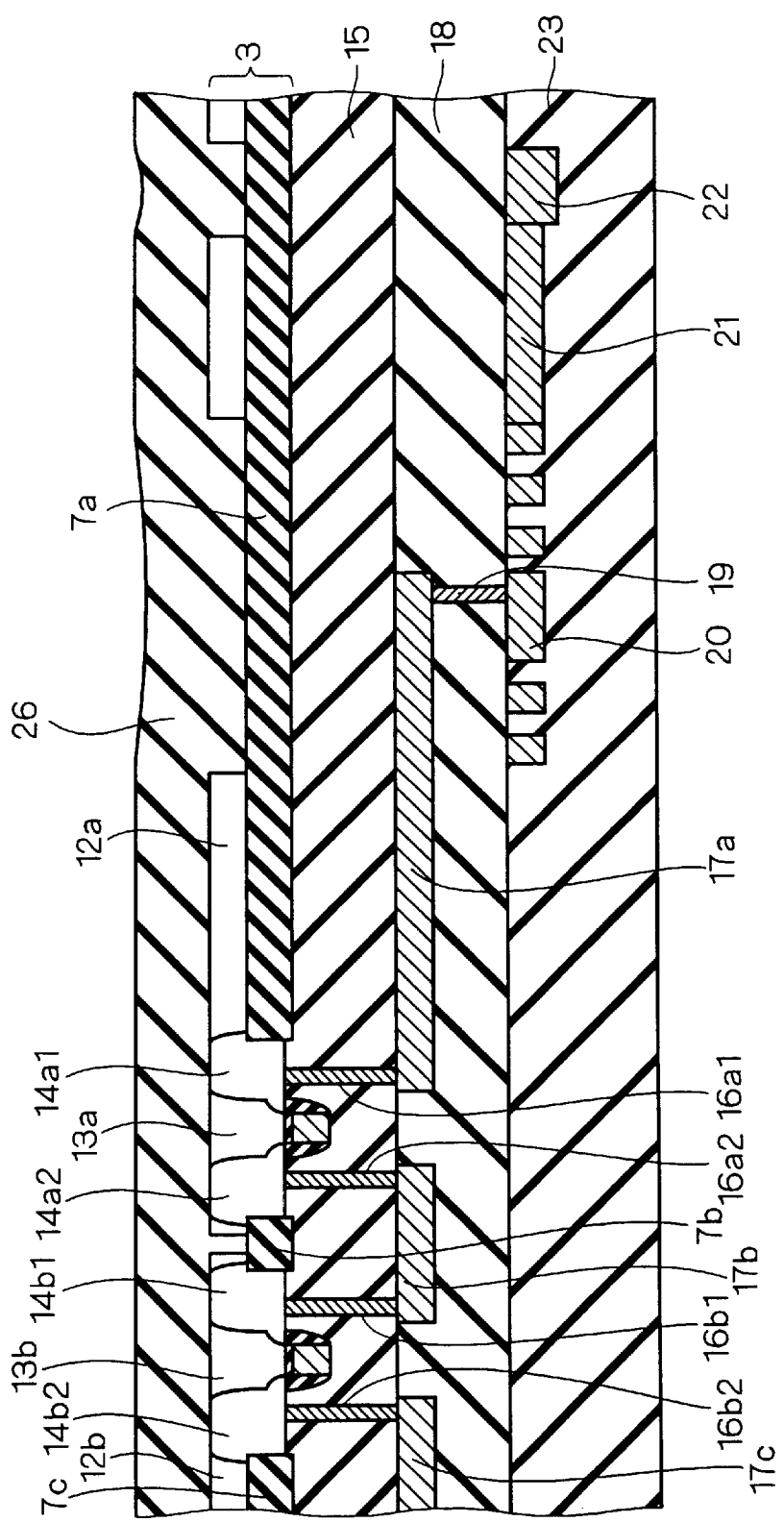
Figure 19:
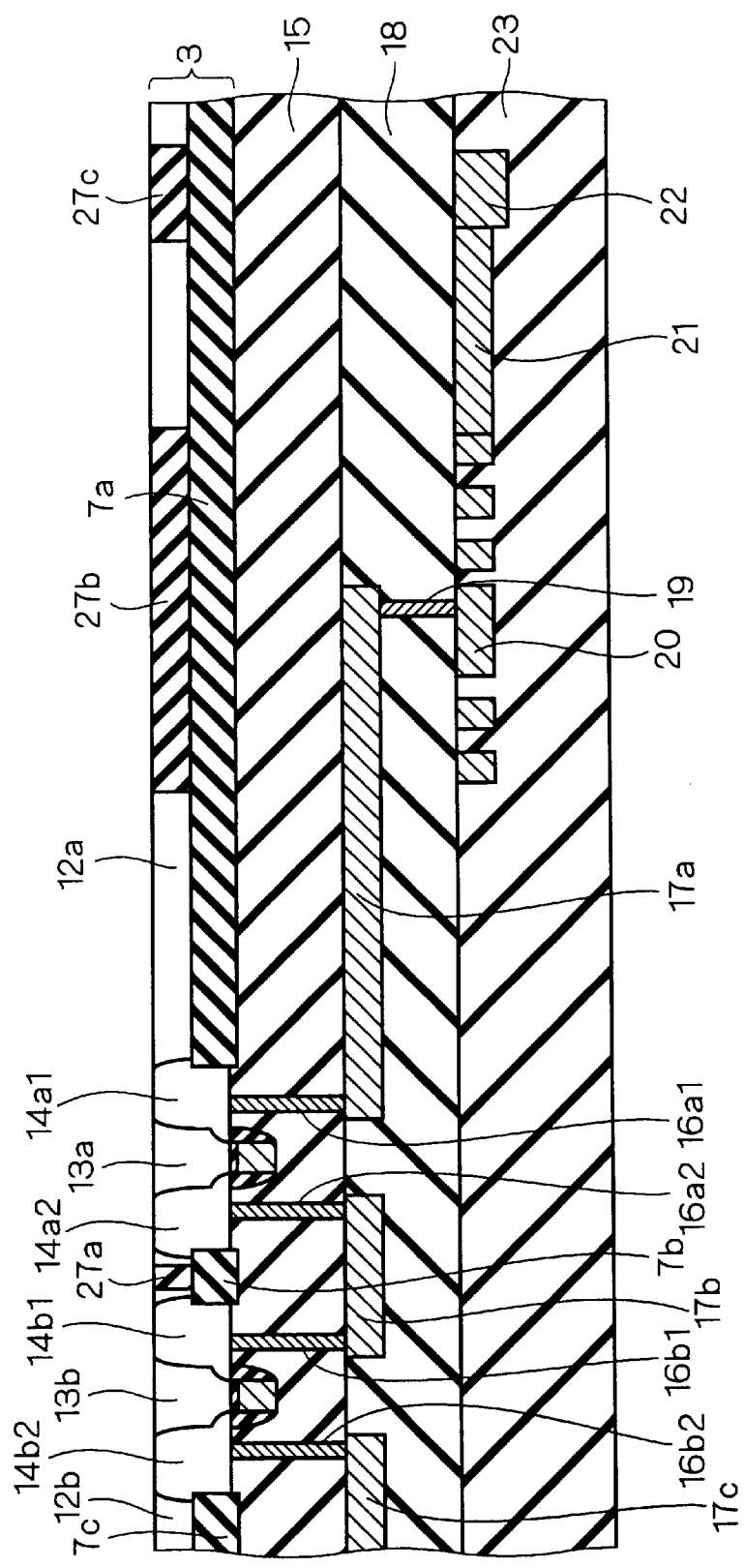

Next, after the photoresists 24a to 24d are removed, an insulating film 26 such as a silicon oxide film is formed over the whole surface in such a thickness as to bury the concave portions 25a to 25c (FIG. 18). Then, the insulating film 26 in a portion positioned on the second main surface of the silicon layer 3 is removed and left only in the concave portions 25a to 25c. For example, it is sufficient that the CMP treatment is carried out until the second main surface of the silicon layer 3 is exposed, for example. Consequently, element isolating films 27a to 27c can be formed in contact with the element isolating film 7a or 7b in the second main surface of the silicon layer 3 (FIG. 19). The complete isolations 27A, 27B and 27C shown in FIG. 1 can be obtained as a combination of the element isolating film 27a and the element isolating film 7b, that of the element isolating film 27b and the element isolating film 7a and that of the element isolating film 27c and the element isolating film 7a, respectively.

Figure 20:
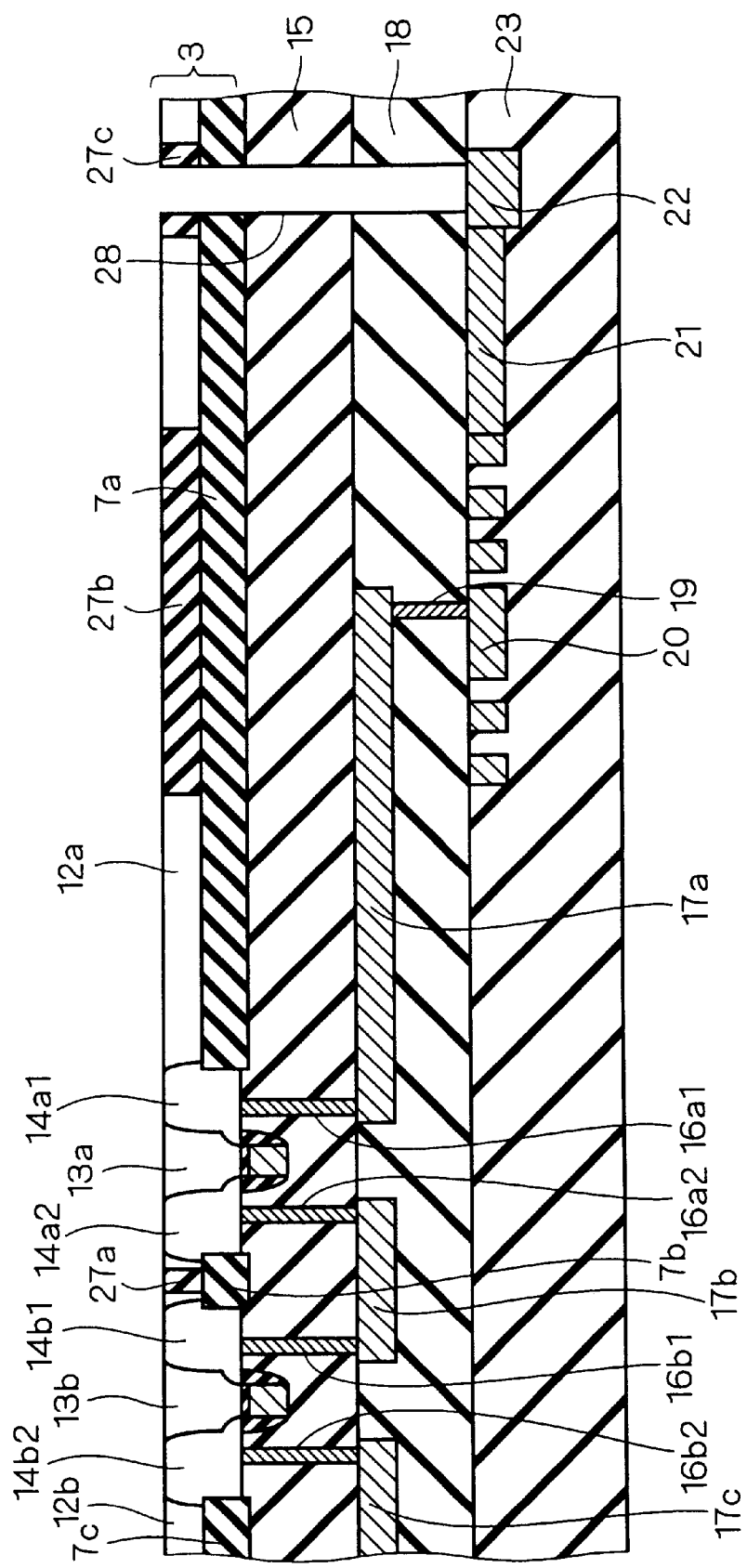

Next, a contact hole 28 for electrically drawing the pad 22 to the outside is selectively formed through the inside of each of the element isolating films 27c and 7a and the interlayer insulating films 15 and 18 (FIG. 20).

After the structure shown in FIG. 18 is obtained, the step of forming the contact hole 28 (FIG. 20) may be executed without executing the step of removing the insulating film 26 (FIG. 19). Thus, it is possible to prevent the whole second main surface of the silicon layer 3 from being exposed to the outside air.

For example, Japanese Patent Application Laid-Open No. 7-161809 (1995) has disclosed a technique for opening a semiconductor layer on a surface opposite to a surface where a partial isolation is carried out, thereby exposing an insulator of the partial isolation and filling the opening with another insulator.

Figure 21:
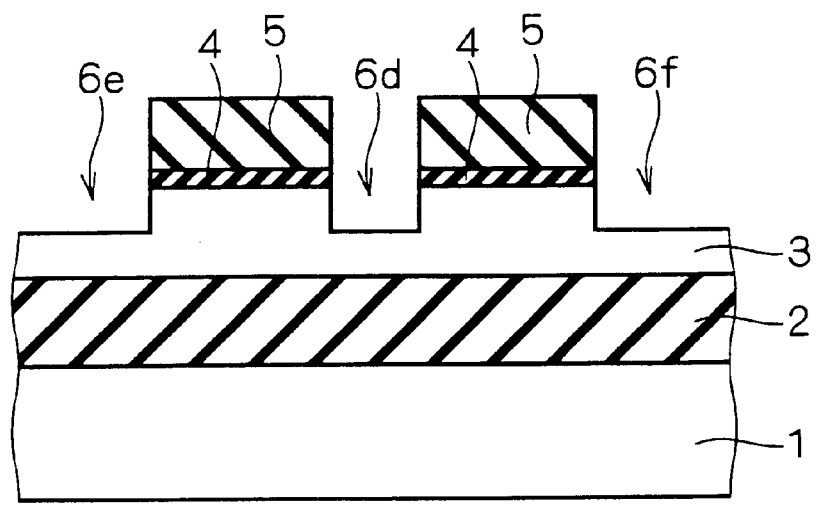

Referring to a section in a position along a line X2 shown in FIG. 1, description will be given to the method of manufacturing a semiconductor device according to the first embodiment. FIGS. 21 to 25 are sectional views showing, in order of steps, the method of manufacturing a semiconductor device according to the first embodiment. First of all, a silicon oxide film 4 and a silicon nitride film 5 are wholly formed over a first main surface of a silicon layer 3 in this order, and etching is carried out by using the patterned silicon nitride film 5 as a mask. Consequently, concave portions 6d to 6f having bottom portions in the silicon layer 3 are formed through the silicon oxide film 4 (FIG. 21). This step is executed together with the step shown in FIG. 2.

Figure 22:
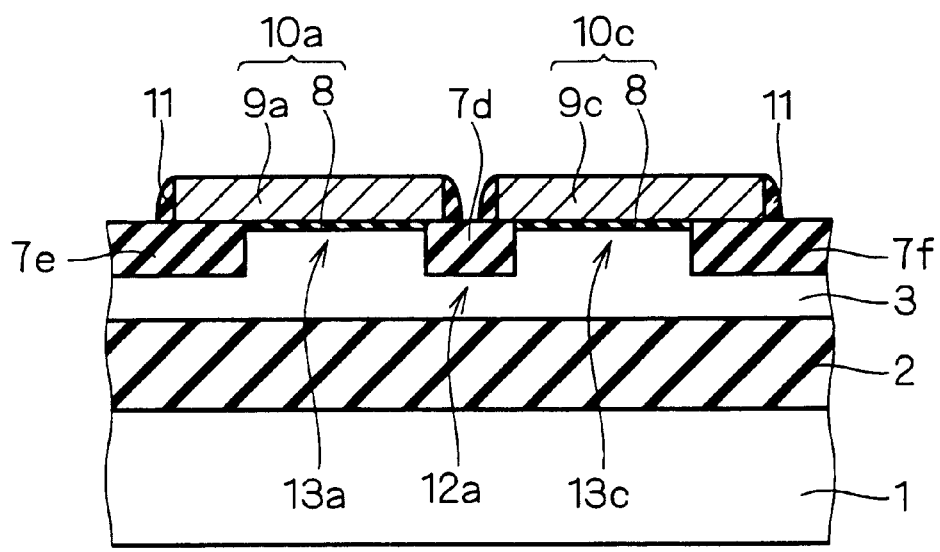

Next, the concave portions 6d to 6f are filled with an insulating film. Thus, element isolating films 7d to 7f of a partial isolation type are formed. This step is executed together with the step shown in FIG. 3. Then, after an n⁻ type N well 12a is formed in the silicon layer 3, a gate structure 10a is formed on the first main surface of the silicon layer 3 in a first element formation region of an SOI substrate defined by the element isolating films 7d and 7e. Furthermore, a gate structure 10c having a multilayer structure in which a gate oxide film 8 and a gate electrode 9c are provided in this order is formed on the first main surface of the silicon layer 3 in a third element formation region of the SOI substrate defined by the element isolating films 7d and 7f. Thereafter, a side wall 11 is formed on side surfaces of the gate structures 10a and 10c. Subsequently, p⁺ type source-drain regions 14a1, 14a2, 14c1 and 14c2 are formed in the silicon layer 3 in the first and third element formation regions. Consequently, an n⁻ type channel formation region 13a is defined under the gate structure 10a and an n⁻ type channel formation region 13c is defined under the gate structure 10c (FIG. 22). These steps are executed together with the step shown in FIG. 12.

By application of considerable variations in which the element isolating films 7a to 7c are formed as described above, the element isolating films 7d to 7f may be formed.

Next, interlayer insulating films 15 and 18 and a support substrate 23 are formed and the silicon layer 1 and the BOX layer 2 are removed at the steps shown in FIGS. 13 to 16.

Figure 23:
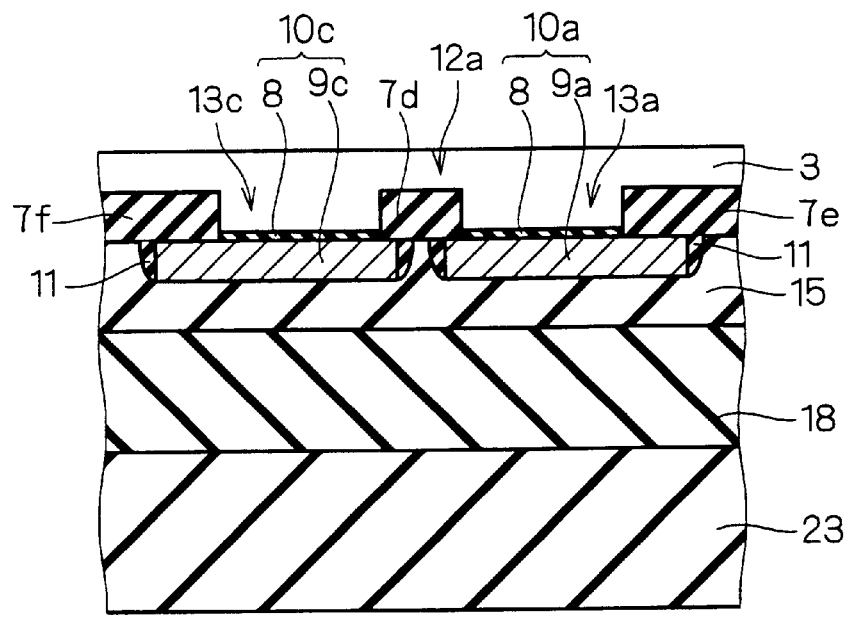
Figure 24:
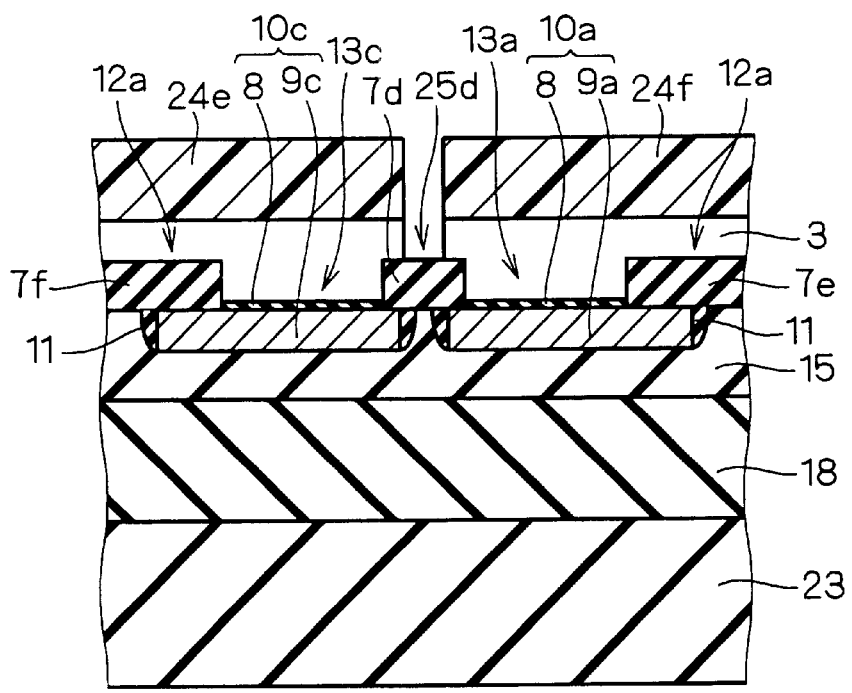

Consequently, a structure shown in FIG. 23 is obtained. Then, photoresists 24e and 24f having opening patterns above a region where a complete isolation is to be formed are provided on a second main surface of the silicon layer 3. More specifically, the opening patterns of the photoresists 24e and 24f are provided above a boundary portion between the PMOSa and the PMOSc. Next, the silicon layer 3 is subjected to etching until the element isolating film 7d is exposed by using the photoresists 24e and 24f as masks. Thus, a concave portion 25d is formed (FIG. 24). This step is executed together with the step shown in FIG. 17. The concave portion 25d may be formed by a method which will be described below in the second embodiment.

Figure 25:
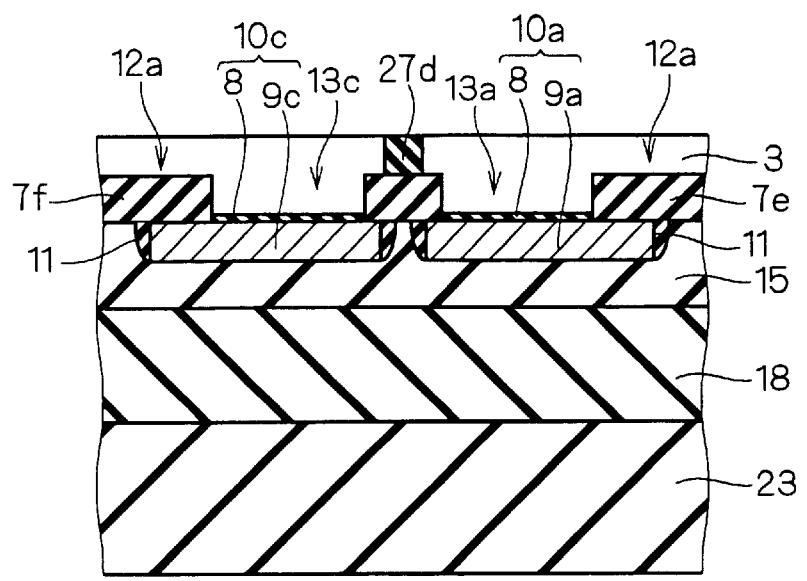

Subsequently, after the photoresists 24e and 24f are removed, the concave portion 25d is filled with an insulating film. Consequently, an element isolating film 27d is formed in contact with the element isolating film 7d (FIG. 25). This step is executed together with the steps shown in FIGS. 18 and 19. Consequently, the complete isolation 27D shown in FIG. 1 can be obtained as a combination of the element isolating film 27d and the element isolating film 7d.

The insulating film 26 may be formed in such a thickness as to bury the concave portions 25d after the photoresists 24e and 24f are removed, and thereafter, the insulating film 26 may be left on the second main surface of the silicon layer 3 without executing the step of removing a portion of the insulating film 26 positioned above the second main surface of the silicon layer 3 (FIG. 19). Thus, it is possible to prevent the whole second main surface of the silicon layer 3 from being exposed to the outside air.

While the concave portions 25b and 25c have been formed separately at the step shown in FIG. 17 in the above description, they may be connected to each other. Consequently, it is possible to obtain a complete isolation to be extended from a portion above the spiral inductor 20 to a portion above the pad 22.

According to the method of manufacturing a semiconductor device according to the first embodiment of the present invention, thus, the element isolating films 7a to 7f of a partial isolation type are formed in the first main surface of the silicon layer 3, the PMOSa, the NMOSb, the PMOSc and the NMOSd are formed and the element isolating films 27a to 27d connected to the element isolating films 7a to 7d are then formed on the second main surface side of the silicon layer 3. Consequently, the complete isolations 27A to 27D are obtained. Accordingly, the PMOSa and NMOSb and the PMOSc and NMOSd of different conductivity types are electrically isolated from each other through the complete isolation 27A, respectively. Consequently, the generation of latch up can be avoided.

Moreover, the PMOSa and PMOSc and the NMOSb and NMOSd which are formed in the wells 12a and 12b of the same conductivity type are electrically isolated from each other through the complete isolation 27D, respectively. Consequently, it is possible to prevent a cross talk from being generated between adjacent circuits. In addition, the element isolating film 7d of the partial isolation type is present on both sides of the element isolating film 27d as seen on a plane. Therefore, a body contact can be taken.

Furthermore, the complete isolation 27C and the complete isolation 27B are formed below the pad 22 and the spiral inductor 20 in FIG. 1. Therefore, it is possible to prevent a parasitic capacitance from being generated between the pad 22 and spiral inductor 20 and the silicon layer 3. As a result, a power loss can be reduced and the characteristics of a high frequency circuit can be enhanced.

Second Embodiment

Figure 26:
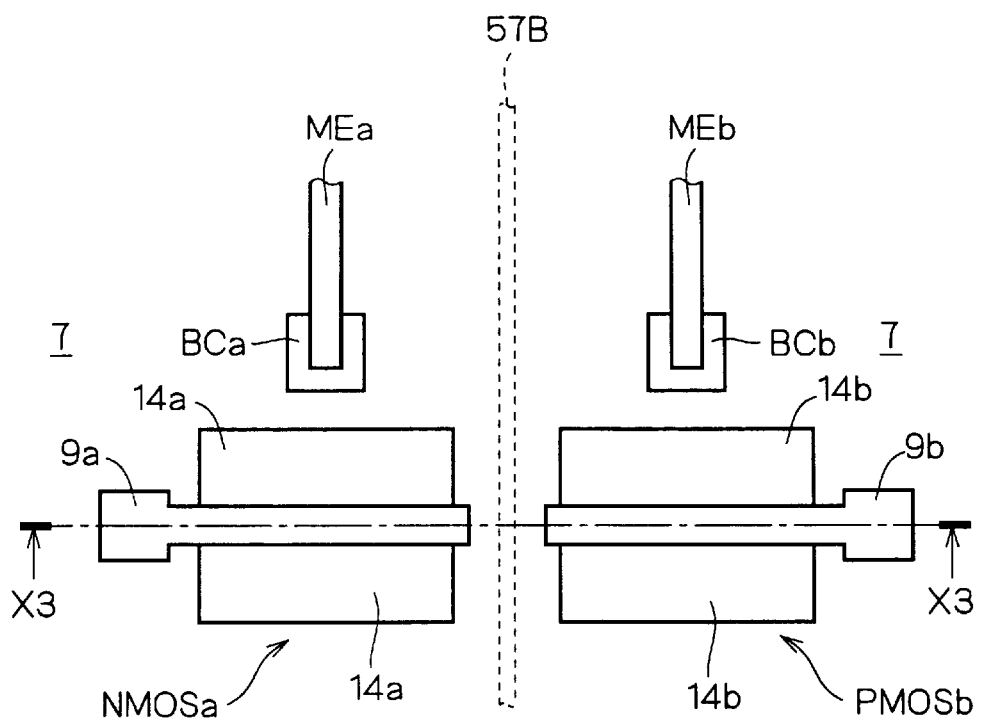
FIG. 26 is a top view typically showing an example of a layout of the semiconductor device.

FIG. 26 is a top view typically showing an example of a layout of a semiconductor device. The semiconductor device shown in FIG. 26 comprises an NMOSa formed in a P well (not shown) and a PMOSb formed in an N well (not shown) adjacently to the NMOSa. The NMOSa has a source-drain region 14a and a gate electrode 9a, and the PMOSb has a source-drain region 14b and a gate electrode 9b.

The semiconductor device shown in FIG. 26 comprises a body contact region BCa for fixing an electric potential of a channel formation region (which overlaps with the gate electrode 9a and does not appear in FIG. 26) of the NMOSa. The body contact region BCa is connected to a metal wiring MEa. Moreover, the semiconductor device shown in FIG. 26 comprises a body contact region BCb for fixing an electric potential of a channel formation region (which overlaps with the gate electrode 9b and does not appear in FIG. 26) of the PMOSb. The body contact region BCb is connected to a metal wiring MEb. A partial isolation 7 and a complete isolation 57B are formed between the NMOSa and the PMOSb.

Figure 27:
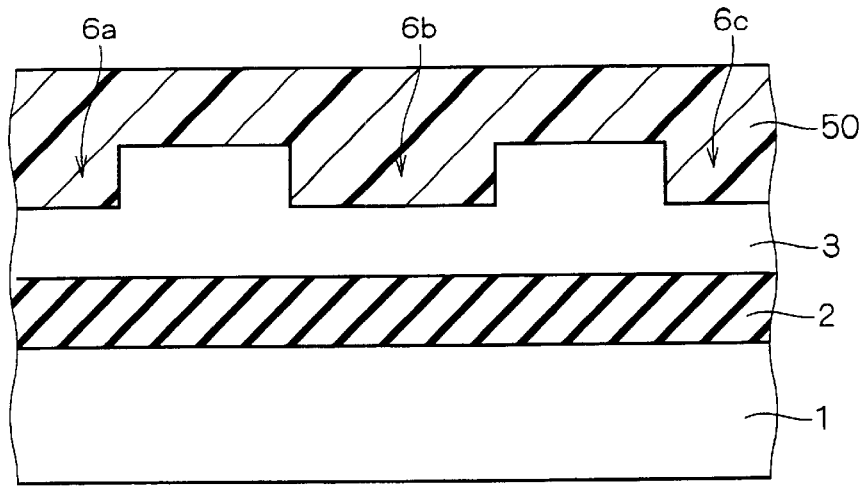
FIGS. 27 to 32 are sectional views showing, in order of steps, a method of manufacturing a semiconductor device according to a second embodiment of the present invention.

Referring to a section in a position along a line X3 shown in FIG. 26, description will be given to a method of manufacturing a semiconductor device according to a second embodiment. FIGS. 27 to 32 are sectional views showing, in order of steps, the method of manufacturing a semiconductor device according to the second embodiment. First of all, an SOI substrate having a multilayer structure in which a silicon substrate 1, a BOX layer 2 and a silicon layer 3 are provided in this order is prepared. Next, concave portions 6a to 6c are selectively formed in an upper surface of the silicon layer 3 respectively by the same method as that according to the first embodiment. Then, a negative photoresist 50 is formed over the whole surface (FIG. 27).

Figure 28:
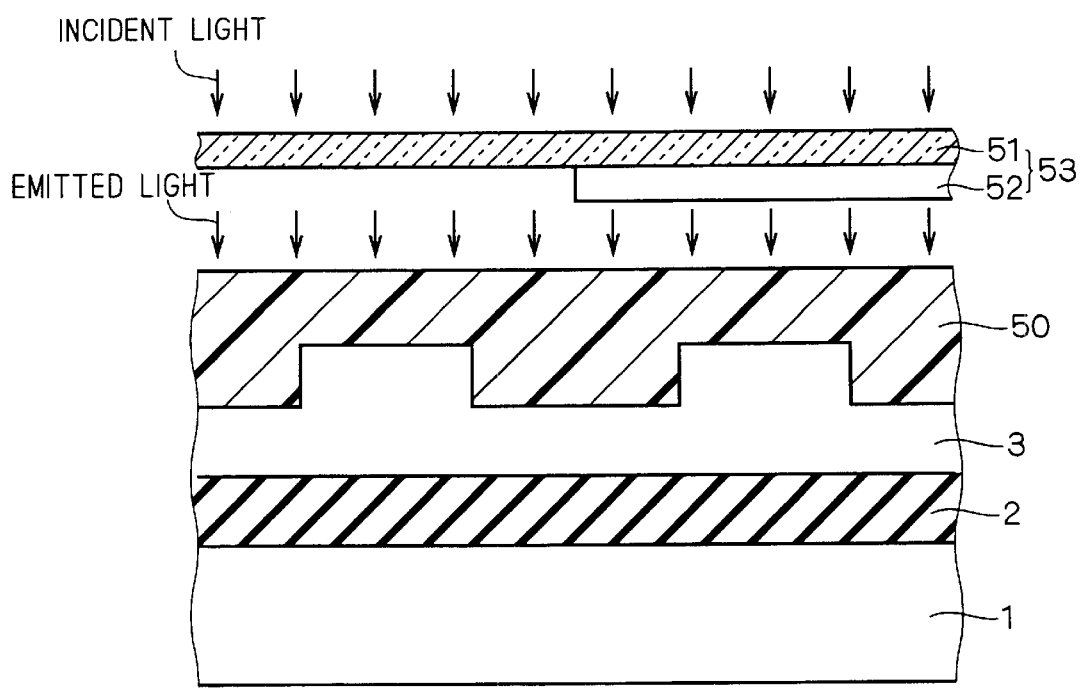

Subsequently, the photoresist 50 is exposed by using a Levenson type phase-shifting mask 53 (FIG. 28). The phase-shifting mask 53 has such a structure that a shifter 52 for inverting a phase of an incident light by 180° is selectively formed on a glass substrate 51. In the second embodiment, the shifter 52 is formed in either of a region where an N well is to be formed and a region where a P well is to be formed (above a region where the N well is to be formed in FIG. 28). Consequently, the photoresist 50 provided above the region where the P well is to be formed is exposed through an emitted light having a phase of 0°, and the photoresist 50 provided above the region where the N well is to be formed is exposed through an emitted light having a phase of 180°. Moreover, emitted lights having phases reverse to each other are canceled so that a light intensity of zero is obtained in a boundary portion between the region where the N well is to be formed and the region where the P well is to be formed.

Figure 29:
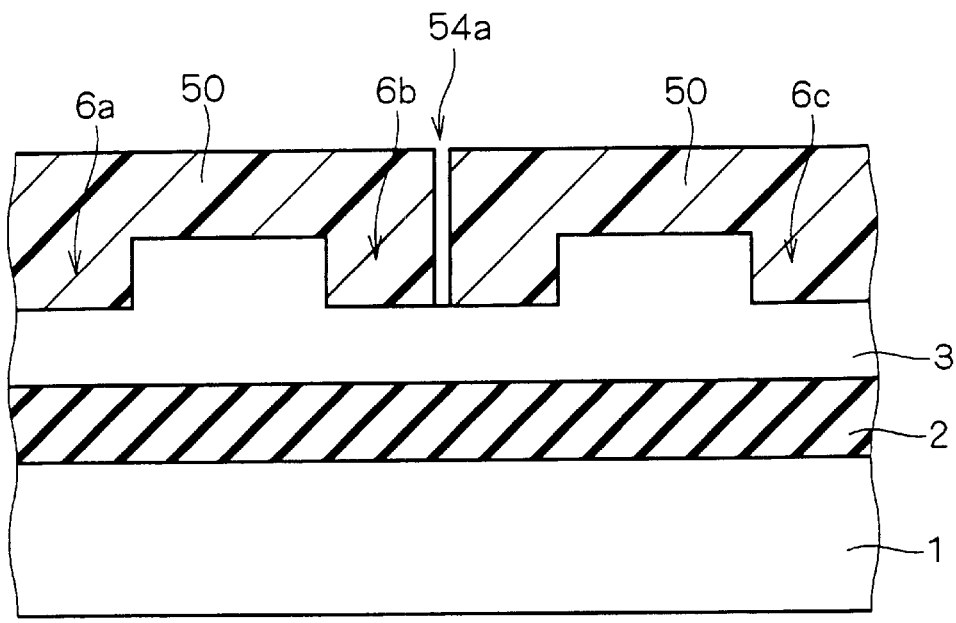

Next, the exposed photoresist 50 is developed. At this time, because the negative photoresist 50 was used, only the photoresist 50 in the boundary portion between the region where the N well is to be formed and the region where the P well is to be formed, being exposed by the emitted light whose light intensity is zero, is dissolved and removed with a developer, and only the upper surface of the silicon layer 3 in the same portion is exposed. Consequently, an opening 54a is formed (FIG. 29). A width of the opening 54a is much smaller than a minimum line width controlled by exposure performance in an ordinary photolithographic technique.

Figure 30:
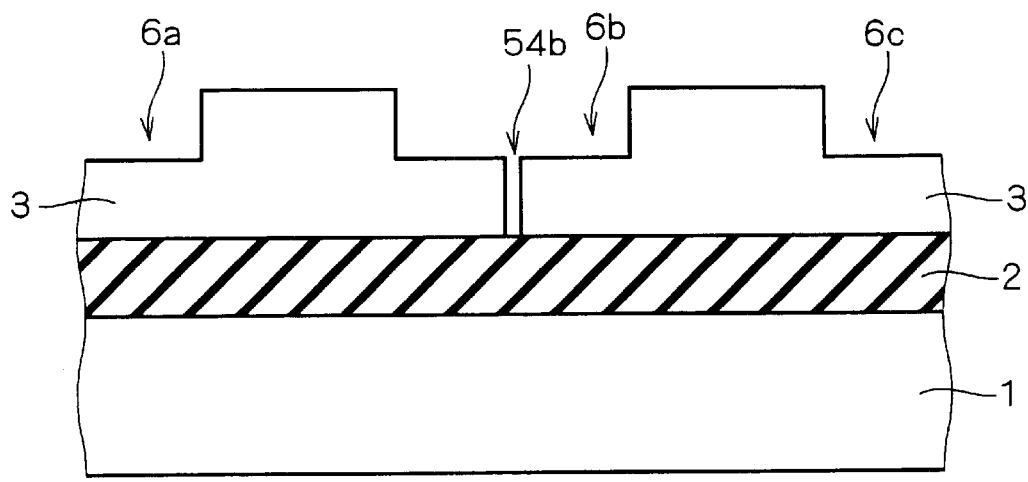
Figure 31:
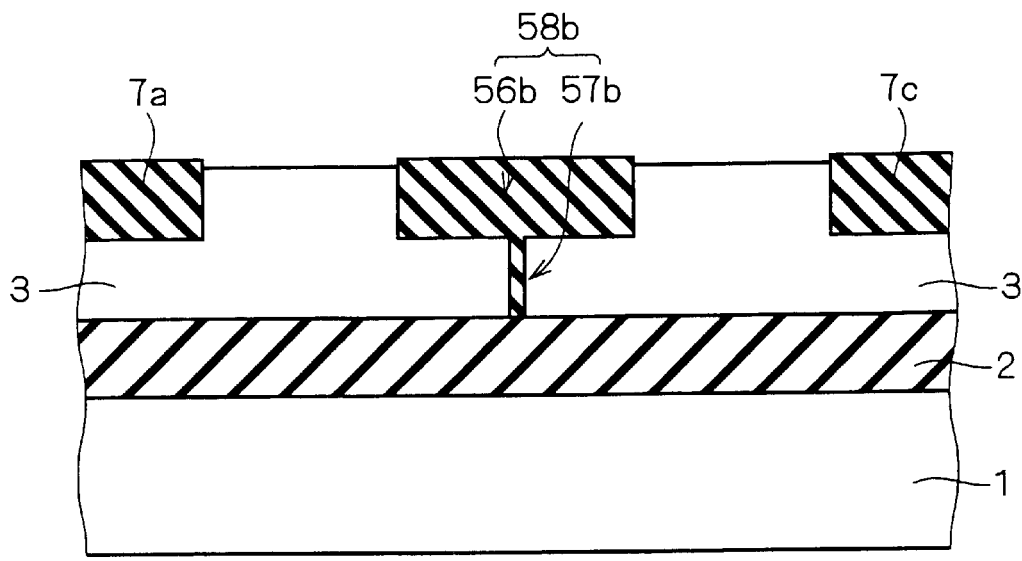

Next, the silicon layer 3 is etched by using, as a mask, the photoresist 50 having the opening 54a formed thereon until the BOX layer 2 is exposed. Consequently, a concave portion 54b is formed. Then, the photoresist 50 is removed (FIG. 30). Next, the concave portions 6a to 6c and 54b are filled with an insulating film such as a silicon oxide film. Thus, element isolating films 7a, 7c and 58b are obtained (FIG. 31). The element isolating film 58b is constituted by a silicon oxide film 57b filled in the concave portion 54b and a silicon oxide film 56b filled in the concave portion 6b. A complete isolation 57B shown in FIG. 26 can be obtained as a combination of the silicon oxide film 57b and the silicon oxide film 56b in a portion positioned on the silicon oxide film 57b.

An element isolating film 58b may be formed by using such a structure that the polysilicon layer 64 is provided between the silicon oxide film 4 and the silicon nitride film 5 as described above.

Next, a p⁻ type P well 12b and an n⁻ type N well 12a are formed in the silicon layer 3. Then, a gate structure 10a having a multilayer structure in which a gate oxide film 8 and a gate electrode 9a are provided in this order is formed on the upper surface of the silicon layer 3 in a first element formation region of an SOI substrate which is defined by the element isolating films 7a and 58b. Moreover, a gate structure 10b having a multilayer structure in which the gate oxide film 8 and a gate electrode 9b are provided in this order is formed on the upper surface of the silicon layer 3 in a second element formation region of the SOI substrate which is defined by the element isolating films 58b and 7c. Next, a side wall 11 is formed on side surfaces of the gate structures 10a and 10b.

Figure 32:
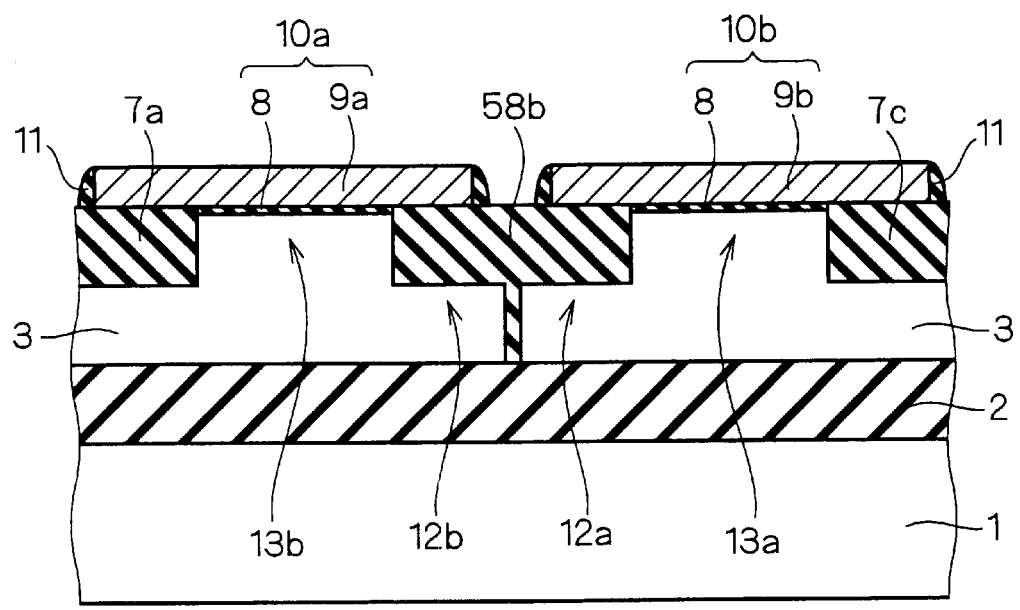

Subsequently, an n⁺ type source-drain region 14a is formed in the silicon layer 3 in the first element formation region. Consequently, a p⁻ type channel formation region 13b is defined under the gate structure 10a. Next, a p⁺ type source drain region 14b is formed in the silicon layer 3 in the second element formation region. Consequently, an n⁻ type channel formation region 13a is defined under the gate structure 10b (FIG. 32).

Figure 33:
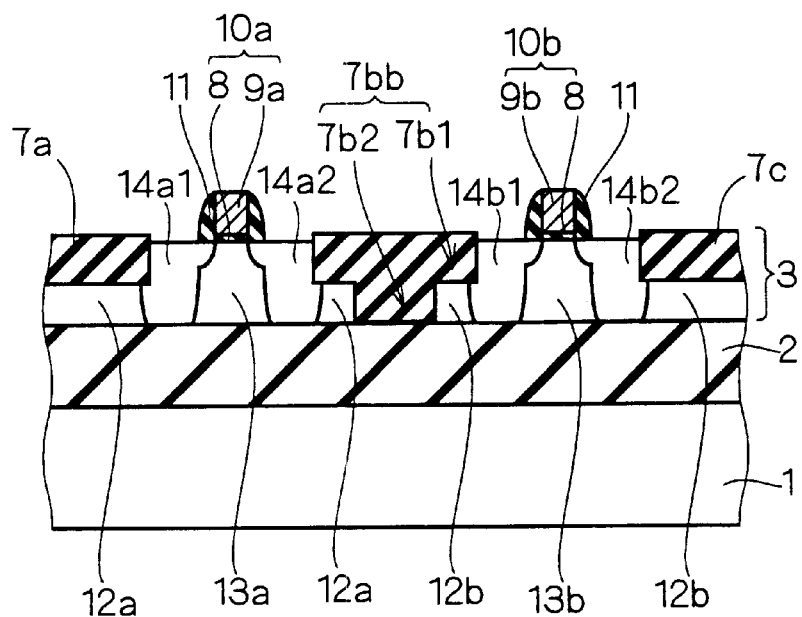
FIG. 33 is a sectional view illustrating a structure of a semiconductor device having an element isolating film of a partial complete isolation type.

By other methods, it is also possible to provide an element isolating film of a partial complete isolation type having such a shape that the upper surface side of the silicon layer is wide and the bottom surface side thereof is narrow in a boundary portion between a PMOS transistor and an NMOS transistor. FIG. 33 is a sectional view illustrating a structure of a semiconductor device including an element isolating film having such a shape. In the boundary portion between the PMOS transistor and the NMOS transistor, an element isolating film 7bb is formed in the upper surface of the silicon layer 3. The element isolating film 7bb has a partial isolating portion 7b1 and a complete isolating portion 7b2 reaching an upper surface of the BOX layer 2 from a bottom surface of the partial isolating portion 7b1.

Such an element isolating film 7bb can be formed in the following procedure. First of all, a first photoresist having an opening pattern above a region where the partial isolating portion 7b1 is to be formed is provided on the upper surface of the silicon layer 3. Next, the silicon layer 3 is etched by using the first photoresist as a mask. Consequently, a first concave portion having a bottom portion in the silicon layer 3 is formed. Then, after the first photoresist is removed, a second photoresist having an opening pattern above a region where the complete isolating portion 7b2 is to be formed is provided. Thereafter, a bottom surface of the first concave portion is etched by using the second photoresist as a mask until the upper surface of the BOX layer 2 is exposed. Consequently, a second concave portion is formed. Subsequently, after the second photoresist is removed, the first and second concave portions are filled with an insulating film. Consequently, the element isolating film 7bb is formed.

In respect of the microfabrication of an element, however, it is desirable that an isolation width of the complete isolating portion 7b2 should be made smaller to reduce an isolation width of the element isolating film 7bb itself in the semiconductor device shown in FIG. 33.

On the other hand, in the method of manufacturing a semiconductor device according to the second embodiment, the isolation width of the element isolating film 58b itself can be reduced for the structure shown in FIG. 32. Therefore, the microfabrication of the semiconductor device can be realized.

After the negative photoresist 50 is formed, it is exposed by using the phase-shifting mask 53 through which the phase of the light emitted above the region where the N well is to be formed and that of the light emitted above the region where the P well is to be formed are reverse to each other. Consequently, it is possible to carry out etching for forming the concave portion 54b for a complete isolation by using, as a mask, the photoresist 50 provided with the opening 54a having a very small width which is obtained by the development. Referring to the structure shown in FIG. 32, accordingly, it is possible to minimize a reduction in a width of each body portion of the N well 12a and the P well 12b with the formation of the complete isolation. Consequently, a body resistance can be prevented from being increased. As a result, a body potential and an operating speed of a circuit can be prevented from being unstable. Thus, it is possible to implement a stable circuit operation.

Third Embodiment

Figure 34:
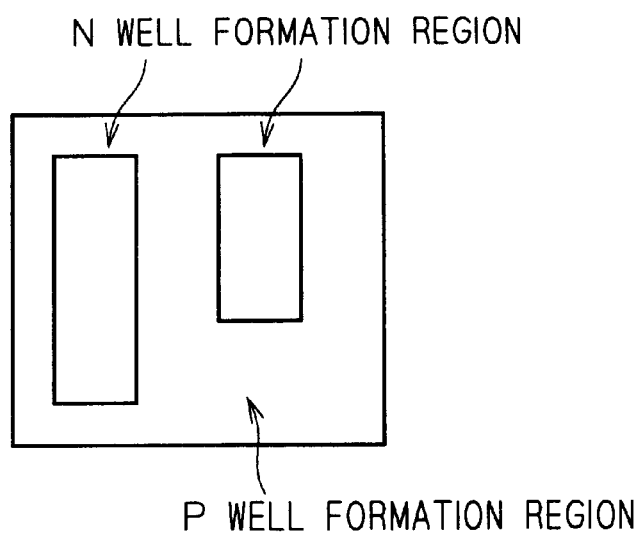
FIGS. 34 to 43 are typical views illustrating a method of creating a shifter pattern of a phase-shifting mask.

Description will be given to a method of creating a shifter pattern of the phase-shifting mask 53 to be used at the step shown in FIG. 28. FIGS. 34 to 43 are typical views illustrating the method of creating the shifter pattern of the phase-shifting mask 53. FIG. 34 shows CAD data on a layout of a well which are created in the design stage of a device. The CAD data shown in FIG. 34 have an N well formation region and a P well formation region. With reference to the CAD data, the shifter pattern is created corresponding to the layout of the well.

Figure 35:
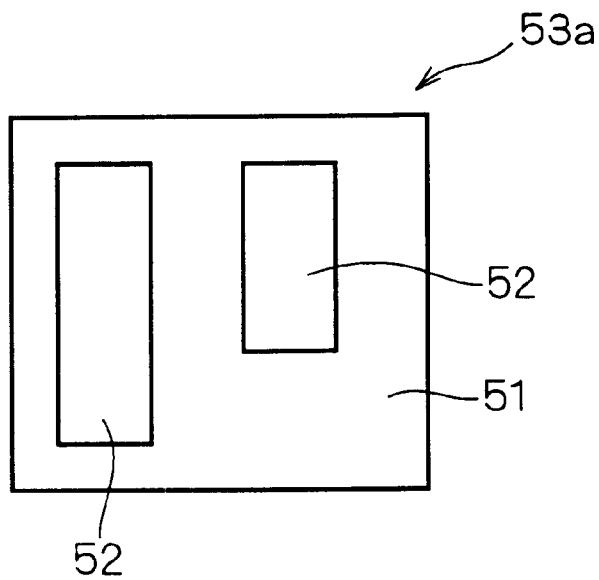
Figure 36:
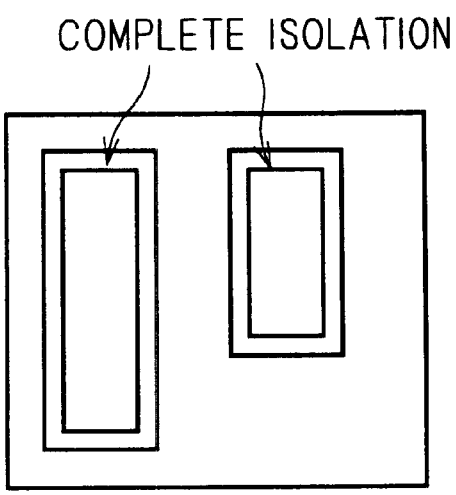

FIG. 35 shows a phase-shifting mask 53a thus fabricated. As shown in FIG. 35, a shifter 52 is formed only in a portion corresponding to the N well formation region of the CAD data in the phase-shifting mask 53a. To the contrary, it is a matter of course that the shifter 52 can be formed only in a portion corresponding to the P well formation region of the CAD data. FIG. 36 shows a complete isolation forming pattern which is obtained as a result of the use of the phase-shifting mask 53a illustrated in FIG. 35. The complete isolation is formed along a boundary between the N well formation region and the P well formation region shown in FIG. 34.

Figure 37:
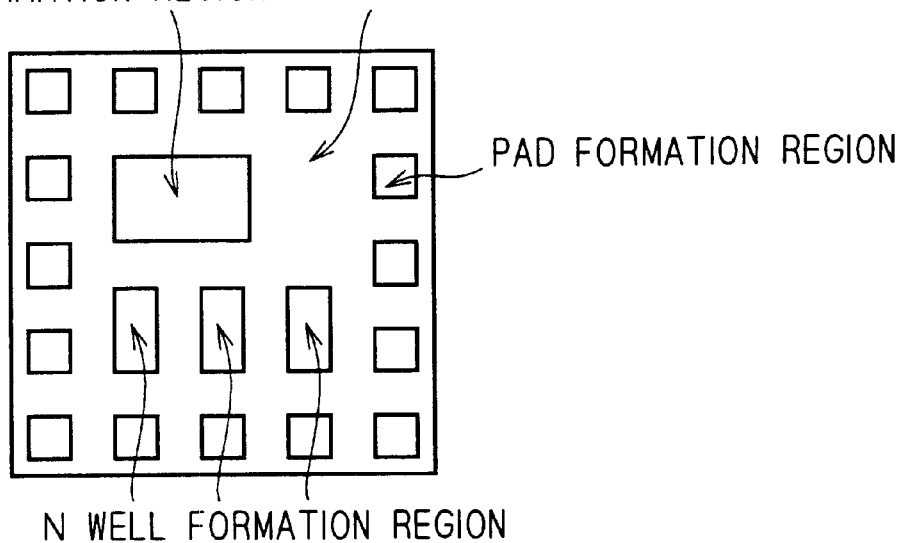

FIG. 37 shows CAD data on a layout of a well, an inductor and a pad which are created in the design stage of the device. The CAD data shown in FIG. 37 have an N well formation region, a P well formation region, an inductor formation region and a pad formation region. With reference to the CAD data, the shifter pattern is created corresponding to a layout of each element shown in FIG. 37.

Figure 38:
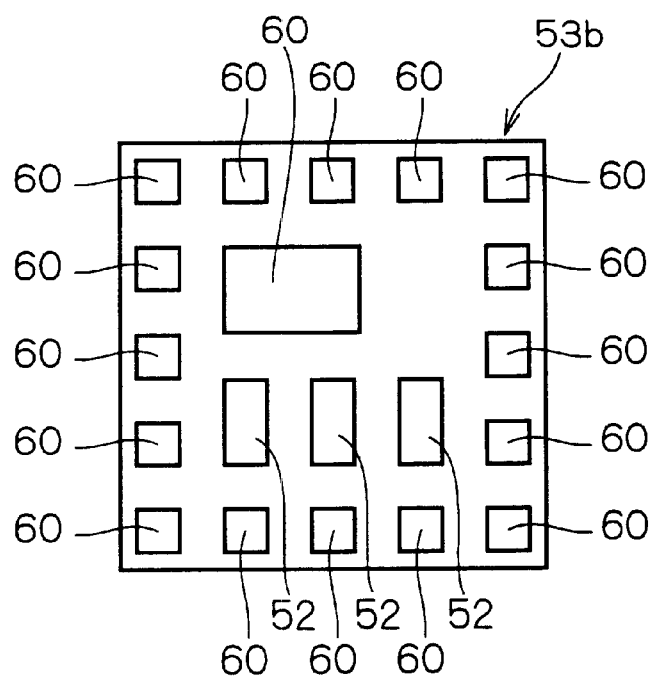
Figure 39:
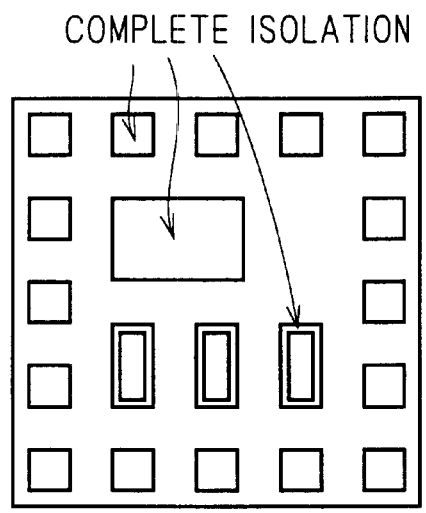

FIG. 38 shows a phase-shifting mask 53b thus fabricated. As shown in FIG. 38, the shifter 52 is formed only in a portion corresponding to the N well formation region of the CAD data in the phase-shifting mask 53b and a light shielding film 60 such as Cr is formed in portions corresponding to the inductor and pad formation regions of the CAD data. A photoresist 50 is not exposed under the light shielding film 60. Therefore, the negative photoresist 50 provided under the light shielding film 60 is removed at a subsequent developing step. FIG. 39 shows a complete isolation forming pattern which is obtained as a result of the use of the phase-shifting mask 53b illustrated in FIG. 38. The complete isolation is formed along the boundary between the N well formation region and the P well formation region shown in FIG. 37, and corresponding to the inductor and pad formation regions shown in FIG. 37.

The complete isolation may be formed between elements which are formed adjacently to each other in a well of the same conductivity type and are easily affected by noises. For example, a semiconductor memory such as a DRAM has a memory cell array having a plurality of memory cells arranged in a matrix and a plurality of sense amplifiers arranged for each column of the memory cell array. In such a semiconductor memory, the complete isolation is formed between the sense amplifiers provided adjacently to each other. Consequently, each sense amplifier can be prevented from being affected by other sense amplifiers.

Figure 40:
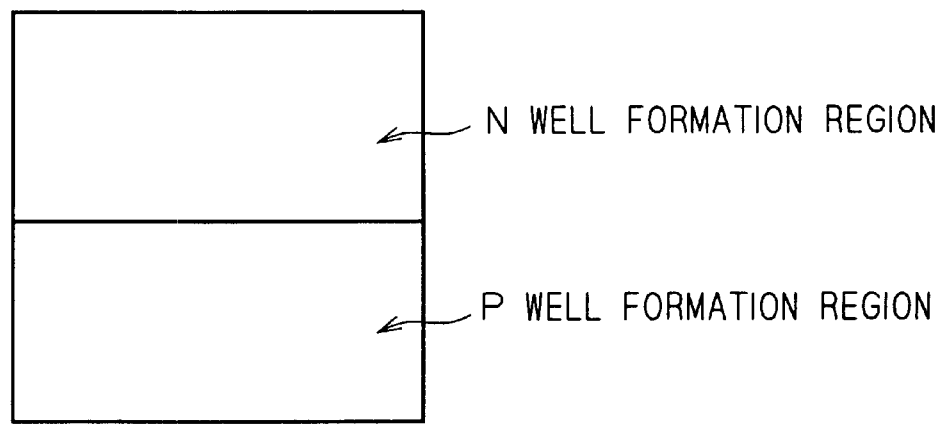

FIG. 40 shows CAD data on the layout of the well which are created in the design stage of the device. The CAD data shown in FIG. 40 have the N well formation region and the P well formation region. With reference to the CAD data, the shifter pattern is created corresponding to the layout of the well.

Figure 41:
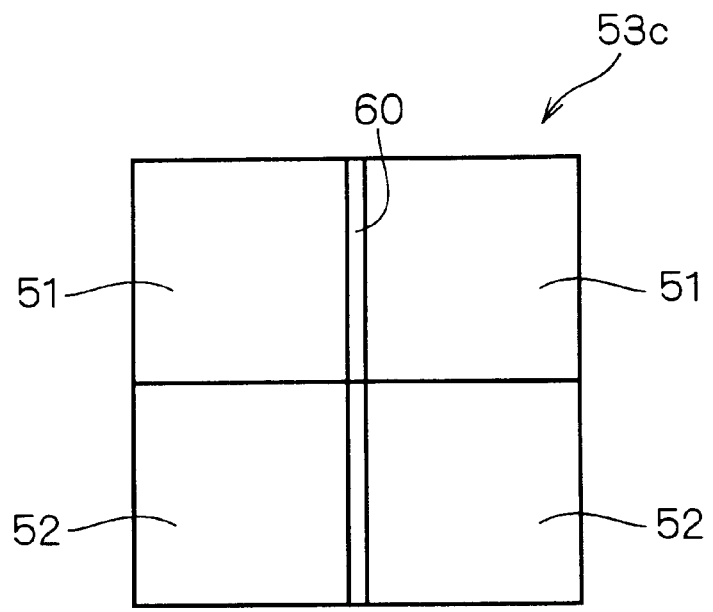
Figure 42:
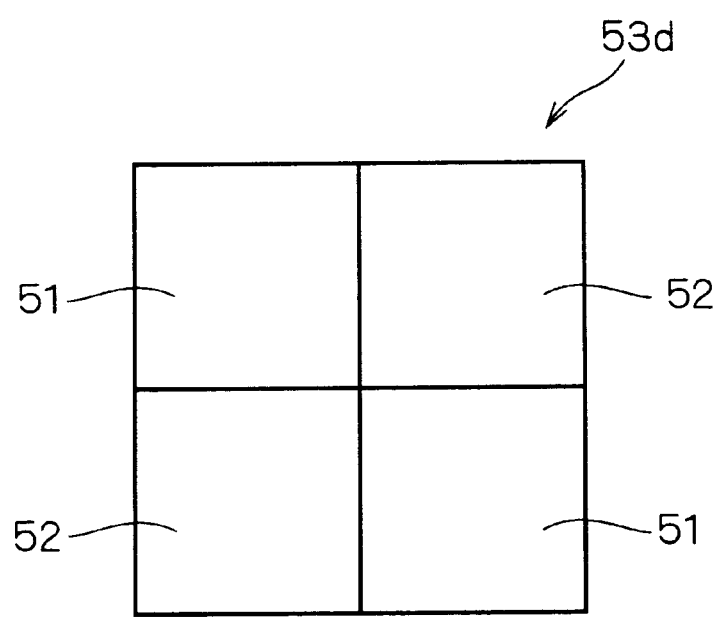

FIGS. 41 and 42 show phase-shifting masks 53c and 53d thus fabricated, respectively. As shown in FIG. 41, the shifter 52 is formed only in a portion corresponding to the P well formation region of the CAD data in the phase-shifting mask 53c. Moreover, a light shielding film 60 is formed in a portion where the complete isolation is to be formed in the well of the same conductivity type. As shown in FIG. 42, furthermore, the shifter 52 is diagonally formed in the phase-shifting mask 53d such that an edge portion of the shifter 52 overlaps with the portion where the complete isolation is to be formed.

Figure 43:
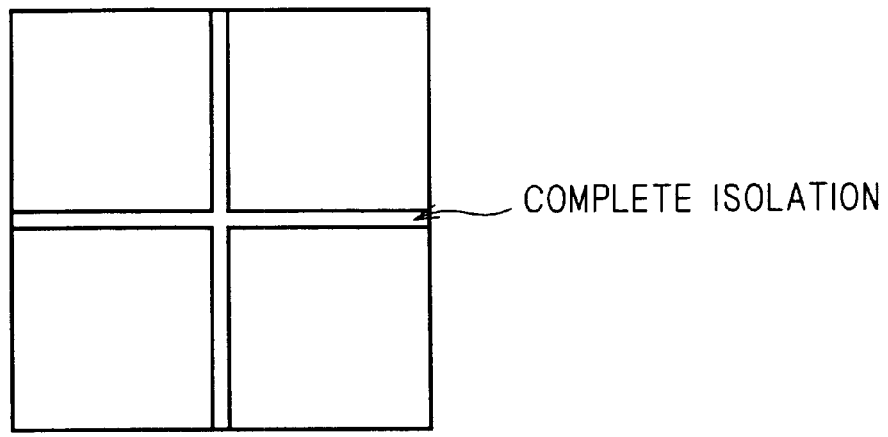
Figure 44:
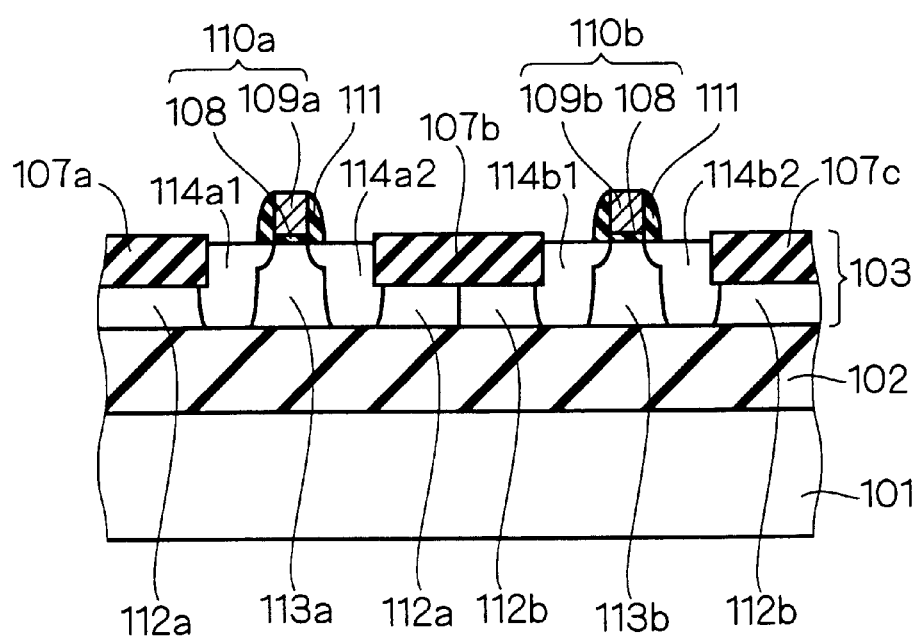
FIG. 44 is a sectional view showing a structure of a conventional semiconductor device.

FIG. 43 shows a complete isolation forming pattern which is obtained as a result of the use of the phase-shifting masks 53c and 53d shown in FIGS. 41 and 42, respectively. The complete isolation is formed along the boundary between the N well formation region and the P well formation region shown in FIG. 40, and corresponding to the portion where the light shielding film 60 is to be formed as shown in FIG. 41. Alternatively, the complete isolation is formed along the boundary between the region where the shifter 52 is to be formed and a non-formation region shown in FIG. 42.

In the description of the method of manufacturing a semiconductor device according to the second embodiment, the concave portion 54b for the complete isolation has been formed on the upper surface (first main surface) side of the silicon layer 3. However, even if the concave portions 25a to 25d are to be formed on the bottom surface (second main surface) side of the silicon layer 3 as in the method of manufacturing a semiconductor device according to the first embodiment, it is possible to apply the method of creating a shifter pattern according to the third embodiment. In this case, it is apparent that the CAD data should be inverted horizontally to create a shifter pattern.

According to the method of creating the shifter pattern according to the third embodiment, thus, the shifter patterns of the phase-shifting masks 53 and 53a to 53d can easily be formed based on the CAD data created in the design stage. Consequently, a phase-shifting mask having a desirable shifter pattern can be fabricated without creating any new data.

In addition, the shifter pattern is created by referring to the layout data on the pad and the inductor. Consequently, the complete isolation can be formed below the pad and the inductor, and a parasitic capacitance can also be prevented from being generated together with the silicon layer 3.

While the invention has been described in detail, the foregoing description is in all aspects illustrative and not restrictive. It is understood that numerous other modifications and variations can be devised without departing from the scope of the invention.

What is claimed is:

1. A method of manufacturing a semiconductor device, comprising the steps of:
   (a) preparing a substrate having a main surface including a boundary between a first region and a second region;
   (b) selectively forming, in said main surface of said substrate, a concave portion in a portion including said boundary;
   (c) forming a negative photoresist on a structure obtained at said step (b);
   (d) exposing said photoresist by using a photomask through which a phase of a light emitted above said first region and a phase of a light emitted above said second region are reverse to each other;
   (e) developing said photoresist after said step (d);
   (f) removing said substrate in a portion exposed at said step (e), thereby forming a trench; and
   (g) filling said concave portion and said through trench with an insulating film.

2. The method of manufacturing a semiconductor device according to claim 1, wherein said photomask is a Levenson type phase-shifting mask.

3. The method of manufacturing a semiconductor device according to claim 1, wherein said first region is a first well of a first conductivity type,
   said second region is a second well of a second conductivity type,
   said photoresist is exposed by using a phase-shifting mask having a shifter pattern in which a shifter for inverting a phase of an incident light is formed above said first region or above said second region at said step (d), and
   said shifter pattern is created based on design data in which layouts of said first and second wells in said substrate are described.

4. The method of manufacturing a semiconductor device according to claim 1, further comprising the step of (h) forming a semiconductor element having a conductor region on said substrate after said step (g),
   said concave portion being also formed below a region where said conductor region is to be formed at said step (b), and
   said photoresist being exposed by using a photomask having a mask pattern in which a light shielding film is formed above said region where said conductor region is to be formed at said step (d).

5. The method of manufacturing a semiconductor device according to claim 4, wherein said conductor region is a pad.

6. The method of manufacturing a semiconductor device according to claim 4, wherein said conductor region is a spiral inductor.

7. The method of manufacturing a semiconductor device according to claim 4, wherein said mask pattern is created based on design data in which a layout of said conductor region in said semiconductor element is described.

* * * * *

UNITED STATES PATENT AND TRADEMARK OFFICE
CERTIFICATE OF CORRECTION

PATENT NO.     : 6,573,153 B2
DATED          : June 3, 2003
INVENTOR(S)    : Shigenobu Maeda It is certified that error appears in the above-identified patent and that said Letters Patent is hereby corrected as shown below:

<u>Column 14,</u>
Line 28, delete "through".

Signed and Sealed this

Sixteenth Day of March, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,573,153 B2  Page 1 of 1
DATED : June 3, 2003
INVENTOR(S) : Maeda

It is certified that error appears in the above-identified patent and that said Letters Patent is hereby corrected as shown below:

<u>Title page,</u>
Item [63], Related U.S. Application Data, should read:
-- [63]  Continuation of application No. 09/689,793, filed on Oct. 13, 2000, now Pat. No. 6,358,820. --

Signed and Sealed this

Eighth Day of June, 2004

JON W. DUDAS
*Acting Director of the United States Patent and Trademark Office*